United States Patent
Tsuji et al.

[11] Patent Number: 6,058,053
[45] Date of Patent: May 2, 2000

[54] SEMICONDUCTOR MEMORY DEVICE CAPABLE OF HIGH SPEED OPERATION AND INCLUDING REDUNDANT CELLS

[75] Inventors: Takaharu Tsuji; Tsukasa Ooishi; Hiroshi Kato; Shigeki Tomishima; Hiroki Shimano, all of Hyogo, Japan

[73] Assignee: Mitsubishi Denki Kabushiki Kaisha, Tokyo, Japan

[21] Appl. No.: 09/195,212

[22] Filed: Nov. 18, 1998

[30] Foreign Application Priority Data

May 28, 1998 [JP] Japan .................................. 10-147477

[51] Int. Cl.[7] ........................................................ G11C 7/00
[52] U.S. Cl. ........................ 365/200; 365/230.03; 365/196
[58] Field of Search .............................. 365/200, 230.03, 365/230.06, 196, 191, 230.01

[56] References Cited

U.S. PATENT DOCUMENTS

| | | | |
|---|---|---|---|
| 4,858,192 | 8/1989 | Tatsumi et al. | 365/200 |
| 5,379,259 | 1/1995 | Fujita | 365/200 |
| 5,625,596 | 4/1997 | Uchida | 365/200 |

FOREIGN PATENT DOCUMENTS 5-135599  6/1993  Japan .

OTHER PUBLICATIONS

"A Flexible Redundancy Technique for High–Density DRAM's", M. Horiguchi, et al., *IEEE Journal of Solid–State Circuits*, vol. 26, No. 1, Jan. 1991, pp. 12–17.

*Primary Examiner*—David Nelms
*Assistant Examiner*—VanThu Nguyen
*Attorney, Agent, or Firm*—McDermott, Will & Emery

[57] ABSTRACT

In the semiconductor memory device, independent from redundancy determination by a redundancy determining circuit, a word line activating signal (subdecode signal) for setting a word line in a normal block corresponding to a decoded address signal, is activated. A WL driver includes a driver portion for selecting a word line in the normal block, and a driver portion for selecting a spare word line in a redundant block. When redundancy is not to be used as a result of redundancy determination by the redundancy determining circuit, activated subdecode signal is inactivated. If redundancy is to be used as a result of redundancy determination, a corresponding word line is set to the selected state, using the activated subdecode signal. Thus a semiconductor memory device in which substitution can be done at high speed with high efficiency is provided.

17 Claims, 34 Drawing Sheets

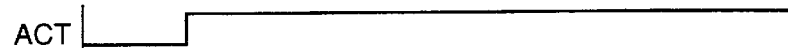
FIG.15A ACT
FIG.15B RA
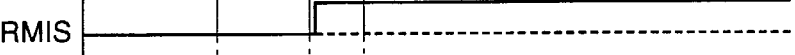
FIG.15C RMIS
FIG.15D RHIT
FIG.15E SIGNAL RMWL
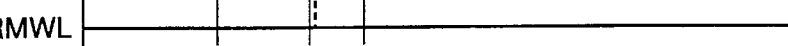
FIG.15F MWL
FIG.15G RMWL
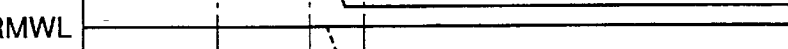
FIG.15H XF0,XF2
FIG.15I /SD
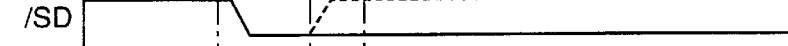
FIG.15J SD
FIG.15K SHR
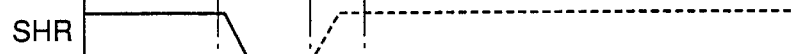
FIG.15L BLEQ
FIG.15M /RSD
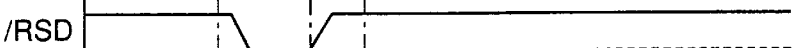
FIG.15N RSD
FIG.15O SHR (REDUNDANT)
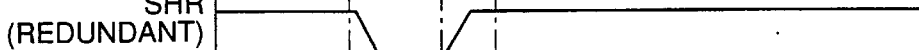
FIG.15P BLEQ (REDUNDANT)
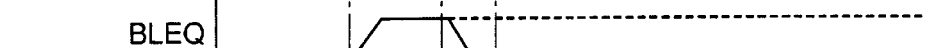
FIG.15Q WL
FIG.15R SWL
τ0  τ1
t0  t1 t2   time

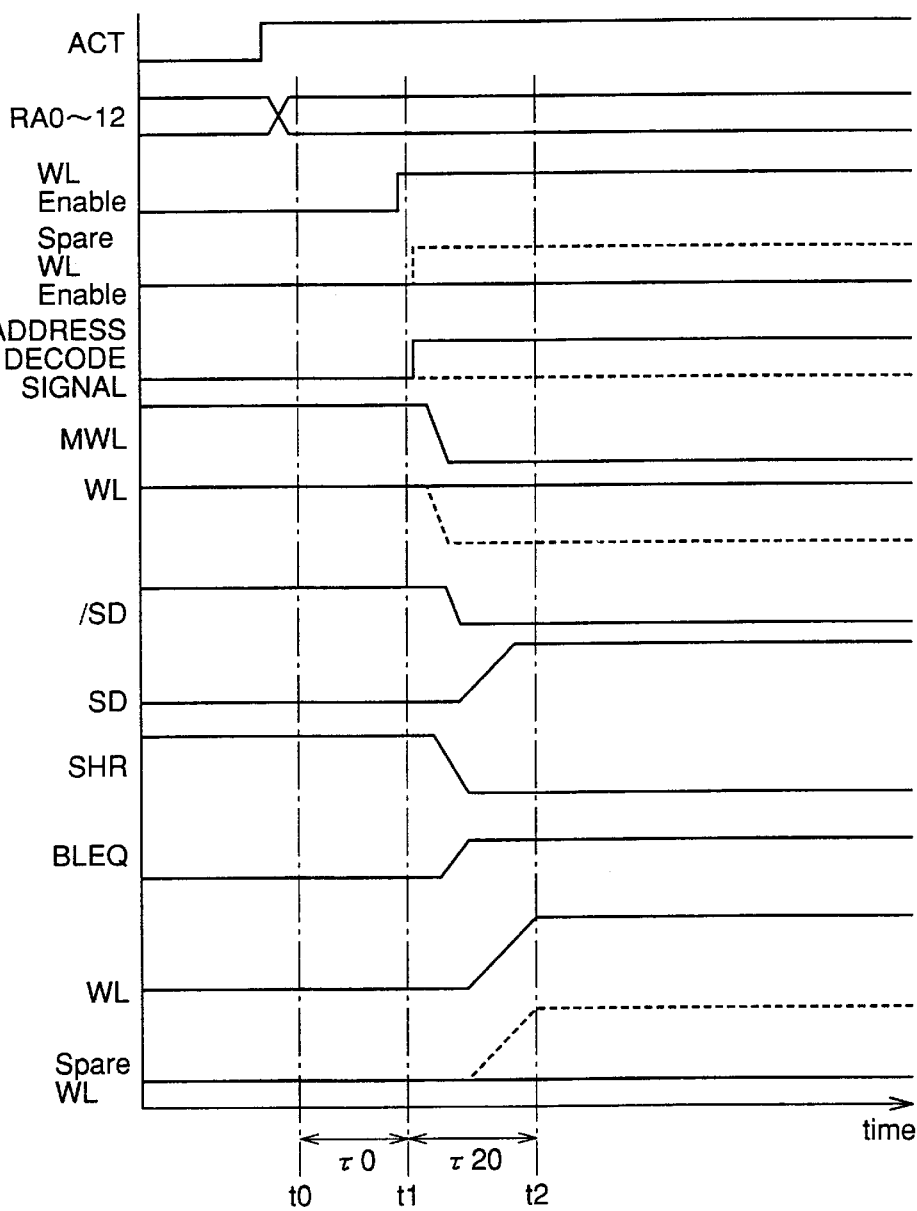

SEMICONDUCTOR MEMORY DEVICE CAPABLE OF HIGH SPEED OPERATION AND INCLUDING REDUNDANT CELLS

BACKGROUND OF THE INVENTION

1. Field of the Invention

The present invention relates to a semiconductor memory device and, more particularly, to a semiconductor memory device including substitutable redundant cells.

2. Description of the Background Art

An example of a conventional semiconductor memory device including redundant cells will be briefly described with reference to FIG. 32.

A conventional semiconductor memory device 9000 shown in FIG. 32 includes a register 901, a row address buffer 902, a row predecoder 212, a redundancy determining circuit 211, a memory cell array 910, a column decoder 903 and a data input/output buffer 904. The conventional semiconductor memory device 9000 has a configuration implementing hierarchical word lines and shared sense amplifier.

Memory cell array 910 includes a plurality of memory blocks 1.0, 1, 1 . . . , . Each memory block includes a normal block (in the figure, represented by the reference characters NBL(0), NBL(1), . . . ) constituted by normal memory cells, and a redundant block (in the figure, represented by the reference characters RBL(0), RBL(1), . . . ) constituted by redundant cells. On both sides of each of memory blocks 1.0, . . . , sense amplifier blocks 2 are arranged. Adjacent memory blocks share one sense amplifier block 2.

Register 901 receives external signals (external row address strobe signal /RAS, external column address strobe signal /CAS, external chip selected signal /CS, chip select signal /CS, external write enable signal /WE, external clock signal CLK, external clock enable signal /CKE and so on), and provides corresponding control signals.

Row address buffer 902 provides a row address signal in response to external address signals (A0 to Ai). Row predecoder 212 provides a decode signal designating a main word line MWL based on an output from row address buffer 902, in response to an enable signal PDE output from redundancy determining circuit 211. Row predecoder 212 further provides, based on an output from row address buffer 902, a corresponding block selecting signal.

Data input/output buffer 904 is for signal exchange between data I/O pins DQ0 to DQn and memory cell array 910 under the control of column decoder 903.

An SD driver/SA driver 924 and an MWL driver 925 are provided for memory cell array 910. SD driver /SA driver 924 provides a shared gate signal for controlling activation of the sense amplifier, and a subdecode signal for activating a word line. MWL driver 925 sets a main word line to a selected state.

Redundancy determining circuit 211 determines whether redundancy is to be used or not. When redundancy is to be used, a redundant main word line selecting signal for setting a redundant main word line RMWL to the selected state, is provided.

An WL driver 914 shown in FIG. 33 is arranged for each of the memory blocks 1.0, . . . .

Configuration of WL driver 914 in the conventional semiconductor memory device shown in FIG. 32 will be described with reference to FIG. 33.

Memory block 1.1 includes a plurality of redundant and normal memory cells MC, a plurality of bit line pairs BL(0) and /BL(0), . . . , a plurality of word lines WL(n), WL(n+1), . . . , and a plurality of spare word lines SWL(0), SWL(1), . . . . The plurality of bit line pairs are arranged corresponding to respective columns. The plurality of word lines and the spare word lines are arranged corresponding to respective rows.

Sense amplifier blocks (2a, 2b in the figure) are arranged for memory block 1.1. Sense amplifier blocks 2a and 2b each include a plurality of sense amplifiers S/A, a plurality of equalize circuits constituted by PMOS transistors PT10 and a plurality of S/A share circuits constituted by NMOS transistors NT10, NT11, NT12 and NT13.

WL driver 914 sets one of word lines WL(n) and WL(n+1) or one of spare word lines SWL(0) and SWL(1) to the selected state, based on signals on main word lines MWL(0), . . . , MWL(m) or the signal on redundant main word line RMWL and based on subdecode signals SD(0), /SD(0), SD(1), /SD(1), . . . . The redundant main word line and the spare word lines are used for selecting a redundant cell.

WL driver 914 includes, corresponding to each word line and spare word line, PMOS transistor PT1 and NMOS transistors NT1 and NT2. For example, PMOS transistor PT1 provided for word line WL(0) has one terminal receiving subdecode signal SD(1) and the other terminal connected to one terminal of NMOS transistor NT1. PMOS transistor PT1 and NMOS transistor NT1 have respective gate electrodes connected to main word line MWL. A connection node between PMOS transistor PT1 and NMOS transistor NT1 is connected to word line WL(0). NMOS transistor NT2 has one terminal connected to word line WL(0), the other terminal connected to the ground potential, and receives at its gate electrode, a subdecode signal /SD (1) which is an inversion of subdecode signal SD(1). As a result, by the subdecode signal or the redundant subdecode signal, any one of the word lines or the spare word lines is set to the selected state.

A memory cell array having redundancy area arrangement has come to be indispensable in a semiconductor memory device. The conventional semiconductor memory device 9000 shown in FIG. 32 is, in this point, provided with a structure having high repairing efficiency, as substitution over memory blocks is possible.

Generally, however, in the semiconductor memory device including redundant cells, a block to be activated is not determined until after redundancy determination, and therefore access speed is not satisfactorily high.

This problem will be described with reference to FIGS. 34A to 34M, taking the conventional semiconductor memory device shown in FIG. 32 as a specific example.

Referring to FIGS. 34A to 34M, by a bank activation signal ACT, operation of row system starts. Address signals RA0 to RA12 are latched, a word line or a spare word line is selected, and sense amplifiers are activated. When a word line is selected, whether redundancy is to be used or not is determined.

At time t0, the row address reaches redundancy determining circuit 211 and row predecoder 212. Redundancy determination takes place in the period τ0. After redundancy determination, at time t1, a subdecode signal or a redundant subdecode signal is activated to set the corresponding word line or the spare word line to the selected state, and sense amplifiers are set ready.

More specifically, when memory block 1.1 is selected, sense amplifier blocks positioned at opposing ends thereof are set to the active state. In preparation for the operation, in order to cancel equalized state of the bit lines, equalize signal BLEQ is set to the L level, and in order to turn off the shared gate, shared gates SHR (U) and SHE (D) are set to the L level. These operations are completed after redundancy determination and before the rise of the word line.

As a result, a time period of $\tau 0+\tau 20$ (where $\tau 20=t2-t0$) is necessary, from the input of the row address to the rise of the word line.

Another problem is that the layout area is increased when redundant cells are provided.

SUMMARY OF THE INVENTION

An object of the present invention is to provide a semiconductor memory device having redundant cells and capable of high speed operation.

Another object of the present invention is to provide a semiconductor memory device having high repairing efficiency while suppressing layout area.

The semiconductor memory device in accordance with the present invention includes a plurality of memory blocks, each of the plurality of memory blocks including normal blocks including a plurality of normal memory cells arranged in rows and columns, a plurality of word lines arranged corresponding to respective rows and a plurality of bit lines arranged corresponding to respective columns, and a redundant block including a plurality of redundant cells arranged in rows and columns, a plurality of redundant word lines arranged corresponding to respective rows and a plurality of bit lines arranged corresponding to respective columns, in which the redundant cells are used as substitution for the normal memory cell belonging to any of the plurality of memory blocks. The semiconductor memory device further includes a determining circuit for determining whether redundancy is to be used or not, in response to an external address signal, a first control circuit responsive to the external address signal and independent from the result of determination by the determining circuit, for setting a corresponding word line to the selected state, and a second control circuit receiving the result of determination by determining circuit and based on the external address signal, for setting the corresponding redundant word line to the selected state. The first control circuit sets the corresponding word line to a non-selected state, in response to the result of determination to use redundancy, by the determining circuit.

Therefore, an advantage of the present invention is that in a semiconductor memory device allowing substitution using a redundant block over different memory blocks, necessary control (signal generation) for setting the word line to the selected state is performed independent from the operation of determination as to whether redundancy is to be used or not, allowing high speed access.

Especially, independent from the process of determination as to whether redundancy is to be used or not, an activating signals necessary for setting the word line to the selected state is activated and, after redundancy determination, if redundancy is to be used, the activating signal is inactivated. Accordingly, high speed access is possible if redundancy is not to be used.

Further, a decoder for generating the activating signal necessary for setting the word line to the selected state and a decoder for generating an activating signal necessary for setting the redundant word line to the selected state are shared by adjacent blocks, and therefore layout area can be reduced.

The semiconductor memory device in accordance with another aspect of the present invention includes a plurality of memory block, each of the plurality of memory blocks including normal blocks having a plurality of normal memory cells arranged in rows and columns, a plurality of word lines arranged corresponding to respective rows and a plurality of bit line pairs arranged corresponding to respective columns, at least one of the plurality of memory blocks further including a redundant block having a plurality of redundant cells arranged in rows and columns, a plurality of redundant word lines arranged corresponding to respective rows and a plurality of bit line pairs arranged corresponding to respective columns, the redundant cells being used as substitution for the normal memory cell belonging to any of the plurality of memory blocks. The semiconductor memory device further includes a determining circuit responsive to an external address signal for determining whether redundancy is to be used or not, a first control circuit independent from the result of determination by the determining circuit, responsive to the external address signal for setting the corresponding word line to the selected state, and a second control circuit independent from the result of determination by the determining circuit, responsive to the external address signal for setting the corresponding redundant word line to the selected state. The first control circuit, receiving the results of redundancy determination by the determining circuit that redundancy is to be used, performs control so that the corresponding word line is set to the non-selected state, and the second control circuit, responsive to the results of redundancy determination by the determining circuit that redundancy is not to be used, performs control so that the corresponding redundant word line is set to the non-selected state.

A further advantage of the present invention is that in a semiconductor memory device allowing substitution using a redundant block over different memory blocks, control (signal generation) necessary for setting the word line and the redundant word line to the selected state is performed independent from the process of determination as to whether redundancy is to be used or not, and therefore high speed access is possible.

Especially, an activating signal necessary for setting the word line and the redundant word line to the selected state is activated, independent from the process of determination as to whether redundancy is to be used or not, and after redundancy determination, signals other than the necessary signal are inactivated. Therefore, if redundancy is not to be used, high speed access is possible.

Especially, independent from the process of redundancy determination, a control signal for the corresponding sense amplifier is generated. Independent from the process of determination as to whether redundancy is to be used or not, activating signals necessary for setting the word line and the redundant word line to the selected state are activated, and after redundancy determination, signals other than those necessary are inactivated. Accordingly, high speed access becomes possible.

Further, independent from the process of determination as to whether redundancy is to be used or not, activating signals necessary for setting the word line and the redundant word line to the selected state are raised to an intermediate level, a necessary signal is activated after redundancy determination and other signal is inactivated. Accordingly, when redundancy is not to be used, high speed access is possible. Further, as an intermediate level power supply voltage is used, load on the peripheral circuitry can be suppressed, and power consumption can be reduced.

The semiconductor memory device in accordance with a still further aspect of the present invention includes normal blocks each including a plurality of normal memory cells arranged in rows and columns, a plurality of word lines arranged corresponding to respective rows and a plurality of bit lines arranged corresponding to respective columns, a redundant block including a plurality of redundant cells arranged in rows and columns and to be used as substitution for corresponding normal memory cells, a plurality of redundant word lines arranged corresponding to respective rows, and a plurality of bit lines arranged corresponding to respective columns, a determining circuit responsive to an external address signal for determining as to whether redundancy is to be used or not, a first control circuit independent from the result of determination by the determining circuit, responsive to the external address signal for setting the corresponding word line to the selected state, and a second control circuit independent from the result of determination by the determining circuit, responsive to the external address signal, for setting the corresponding redundant word line to the selected state. The first control circuit, responsive to the result of redundancy determination by the determining circuit that redundancy is to be used, controls so that the corresponding word line is set to the non-selected state, and the second control circuit, responsive to the result of determination by the determining circuit that redundancy is not to be used, controls so that the corresponding redundant word line is set to the non-selected state.

Therefore, a further advantage of the present invention is that in a semiconductor memory device having a redundant block, independent from the process of determination as to whether redundancy is to be used or not, activating signals necessary for setting the word line and the redundant word line to the selected state are raised to the intermediate level and, after redundancy determination, a necessary signal is activated and other signal is inactivated, and therefore, when redundancy is not used, high speed access is possible.

As the intermediate level power supply voltage is used, load on the peripheral circuitry can be suppressed, and power consumption can be reduced.

Further, the necessary signals can be activated not at the timing of redundancy determination but at the timing of decoding.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 15A to 15R are timing charts related to the operation of semiconductor memory device 1400 in accordance with the fourth embodiment of the present invention.

FIGS. 34A to 34M are timing charts related to the operation of the conventional semiconductor memory device 9000 shown in FIG. 32.

DESCRIPTION OF THE PREFERRED EMBODIMENTS

[First Embodiment]

Figure 1:
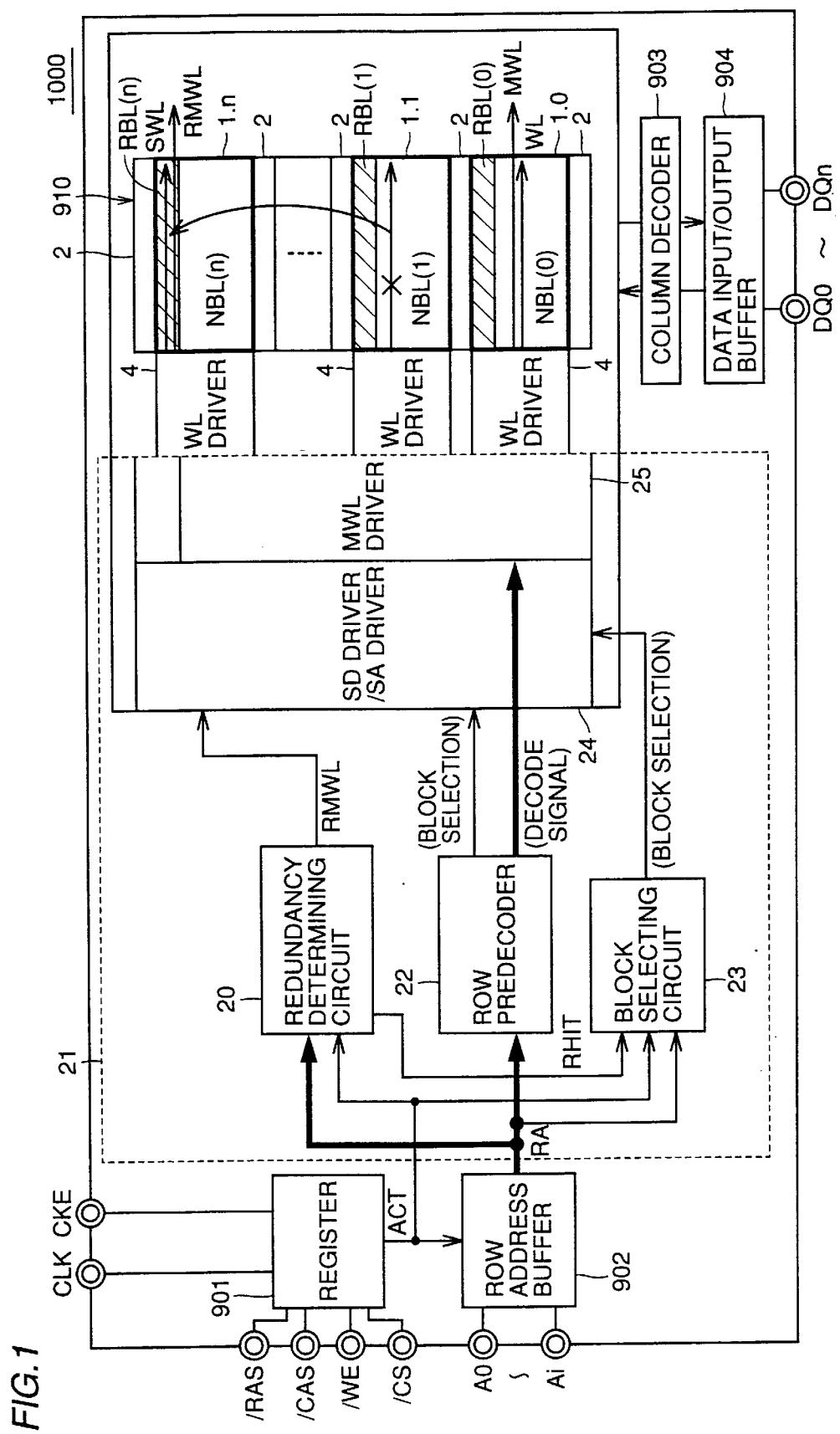
FIG. 1 shows an overall structure of a semiconductor memory device 1000 in accordance with a first embodiment of the present invention.

The semiconductor memory device in accordance with the first embodiment of the present invention will be described. In the semiconductor memory device according to the first embodiment, substitution is possible over memory blocks, and speed of access is improved as the normal row address system and the redundant row address system are controlled independent from each other.

The overall configuration of the semiconductor memory device in accordance with the first embodiment of the present invention will be described with reference to FIG. 1. Components similar to those of the conventional semiconductor memory device 9000 are denoted by the same reference characters and description thereof is not repeated.

Semiconductor memory device 1000 shown in FIG. 1 includes a register 901, a row address buffer 902, a row address decode circuit 21, a column decoder 903, a memory cell array 910 and a data input/output buffer 904. The semiconductor memory device 1000 shown in FIG. 1 has a configuration employing hierarchical word lines and shared sense amplifier.

Memory cell array 910 includes a plurality of memory blocks 1.0, 1.1, . . . . Each memory block includes normal blocks (in the figure, represented by reference characters NBL (0), NBL (1), . . . ) constituted by normal memory cells, and redundant blocks (in the figure, represented by reference characters RBL (0), RBL (1), 1 . . . ) constituted by redundant cells. In semiconductor memory device 1000, it is possible to substitute a redundant block existing in one memory block for another memory block.

Sense amplifier blocks 2 are arranged on both sides of each of the memory blocks 1.0, . . . . Adjacent memory blocks share the sense amplifier block 2. For each of the memory blocks 1.0 . . . , a WL driver 4 is provided.

In the following description, it is assumed that one word line is selected from one of 16 memory blocks each including 64 main word lines in accordance with 8 sets of subdecoder signals. Further, it is assumed that from one of the memory blocks each including one redundant main word line, one spare word line is selected in accordance with 8 sets of redundant subdecode signals.

Row address decode circuit 21 includes a redundancy determining circuit 20, a row predecoder 22, a block selecting circuit 23, an SD driver /SA driver 24 and an MWL driver 25. Redundancy determining circuit 20 performs redundancy determination in response to an activation signal ACT from register 901, based on the address signal from address buffer 902. The redundancy determining circuit provides, as the result of determination, determination signal RHIT, a signal RMWL, and a predecode signal PSDF (in the figure, represented by reference characters RSDF (0) to RSDF (15)) designating the redundant block.

The determination signal RHIT output from redundancy determining circuit 20 is, in the initial state, at the L level. When redundancy is to be used, determination signal RHIT attains to the H level, and any one of the predecode signals RSDF attains to the H level. When redundancy is not to be used, determination signal RHIT and predecode signal RSDF are kept at the L level. Row predecoder 22 decodes an output from row address buffer 902.

Block selecting circuit 23 outputs a block selecting signal corresponding to the normal block, in response to the determination signal RHIT output from redundancy determining circuit 20, based on an output from address buffer 902.

Figure 2:
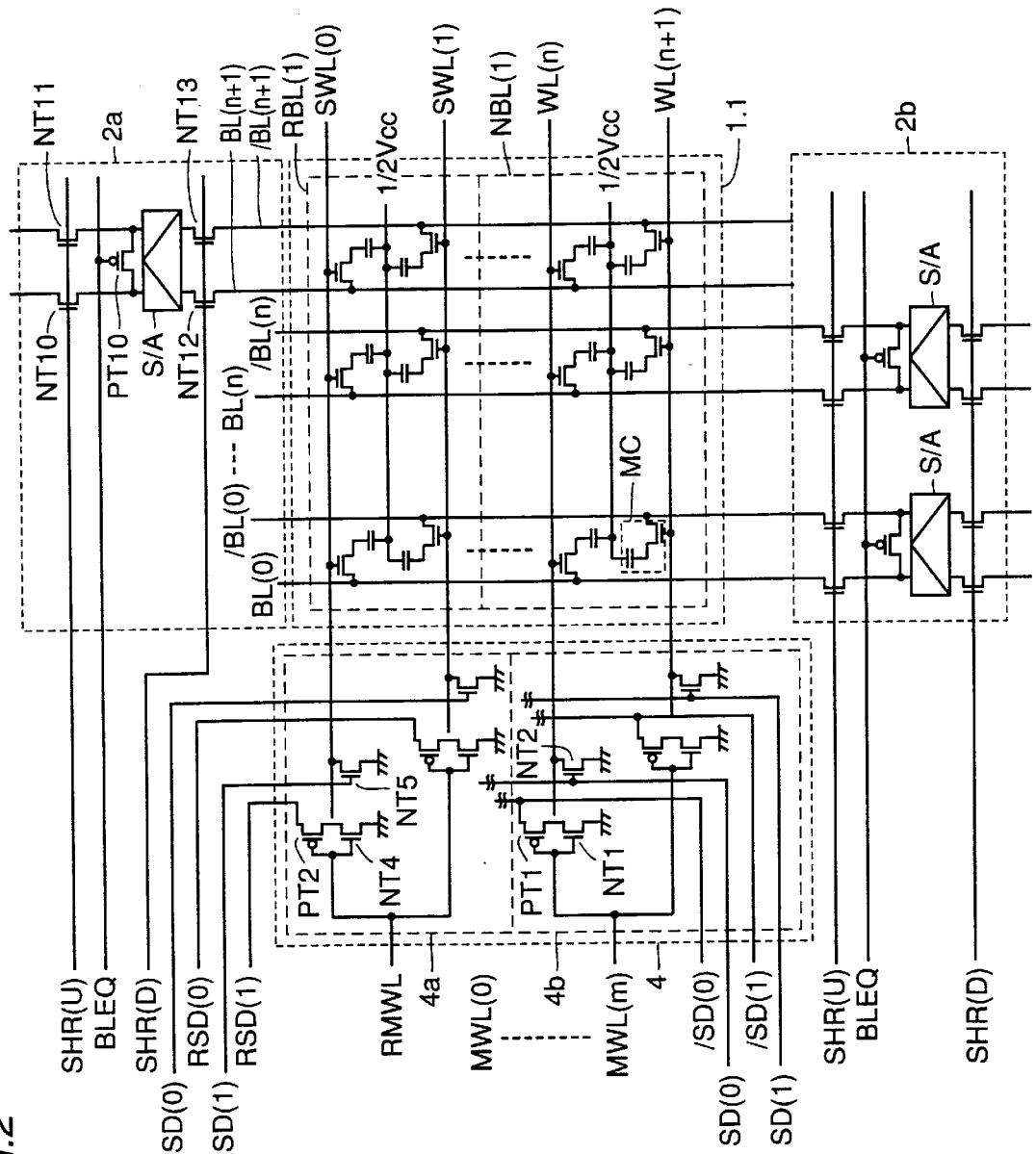
FIG. 2 shows a structure of a WL driver 4 in accordance with the first embodiment of the present invention shown in FIG. 1.

The configuration of WL driver 4 in accordance with the first embodiment of the present invention shown in FIG. 1 will be described with reference to FIG. 2.

Sense amplifier blocks (in the figure, represented by reference characters 2a, 2b) are arranged corresponding to memory block 1.1. Sense amplifier blocks 2a and 2b each include a plurality of sense amplifiers S/A, a plurality of equalize circuits constituted by PMOS transistor PT10, and a plurality of S/A share circuits constituted by NMOS transistors NT10, NT11, NT12 and NT13. PMOS transistor PT10 turns on/off in response to an equalize signal BLEQ. NMOS transistors NT10 and NT11 turn on/off in response to a shared gate signal SHR (U). NMOS transistors NT12 and NR13 turn on/off in response to a shared gate signal SHR (D).

Figure 33:
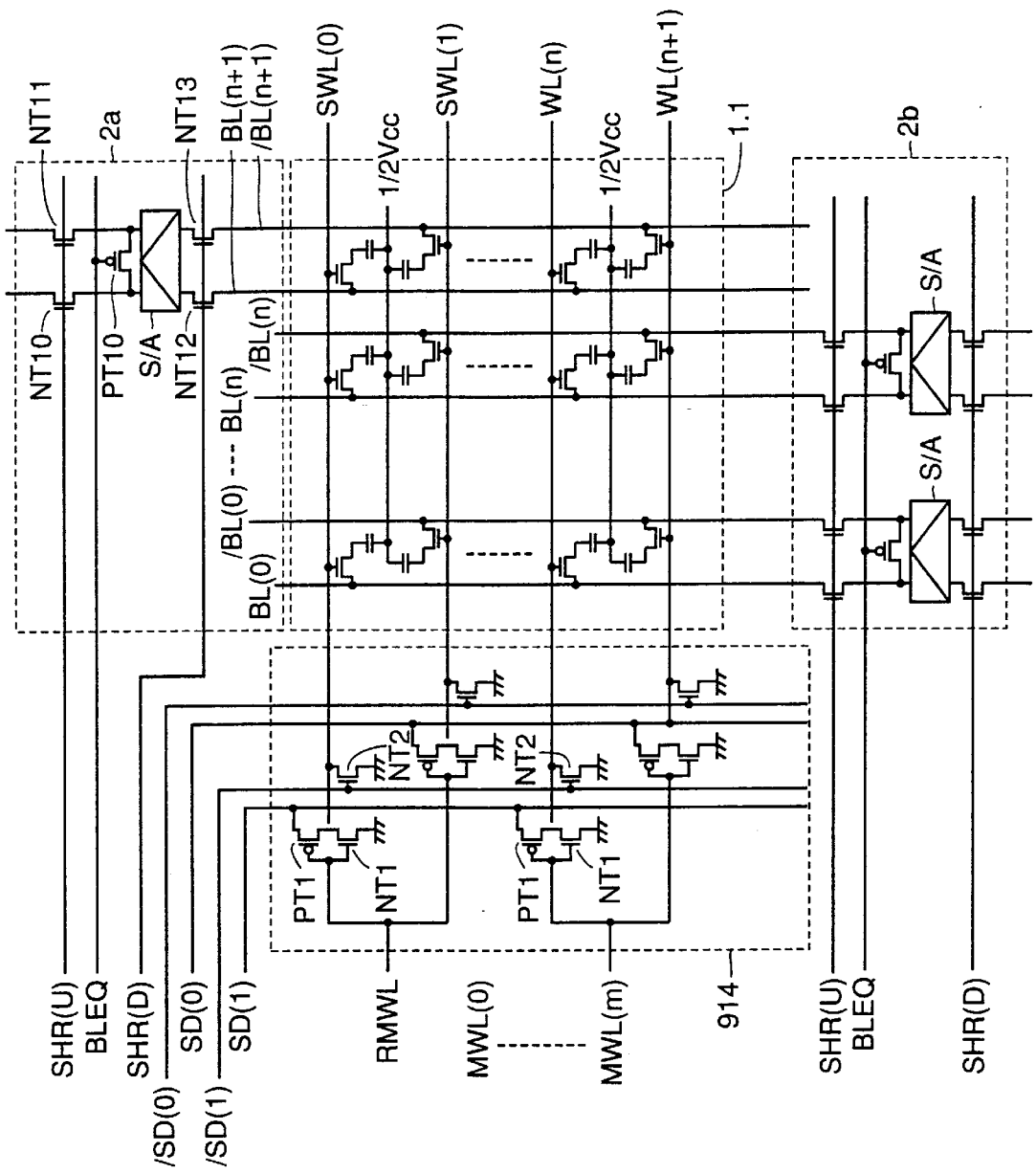
FIG. 33 shows a structure of the WL driver 914 of the conventional semiconductor memory device shown in FIG. 32.

WL driver 4 includes, in addition to a driver 4b for the normal block, a driver 4b for the redundant block. The structure of driver 4b is the same as that described with reference to FIG. 33.

Driver 4b sets one of word lines WL (n), WL (n+1), . . . based on signals on main word lines MWL (0), . . . , MWL (m) as well as subdecode signals SD (0) and /SD (0), SD (1) and /SD (1), . . . .

Driver 4a sets one of spare word lines SWL (0), SWL (1), . . . based on signal on redundant main word line RMWL, as well as redundant subdecode signals RSD (0) and /RSD (0), RSD (1) and /RSD (1), . . . .

Driver 4a includes, corresponding to each spare word line, PMOS transistor PT2 and NMOS transistors NT4 and NT5. For example, PMOS transistor PT2 provided for spare word line SWL (0) has one terminal receiving redundant subdecode signal RSD (1), and the other terminal connected to one terminal of NMOS transistor NT4. PMOS transistor PT2 and NMOS transistor NT4 have respective gate electrodes connected to redundant main word line RMWL. NMOS transistor NT4 has the other terminal connected to the ground potential.

A connection node between PMOS transistor PT2 and NMOS transistor NT4 is connected to a spare word line SWL (0). NMOS transistor NT5 has one terminal connected to spare word line SWL (0), and the other terminal is connected to the ground potential, and it receives at its gate electrode the redundant subdecode signal /RSD (1). The spare word line and the word line are selected through different paths.

The structure of a main portion of row address decode circuit 21 in accordance with the first embodiment of the present invention shown in FIG. 1 will be described with reference to FIG. 3.

Figure 3:
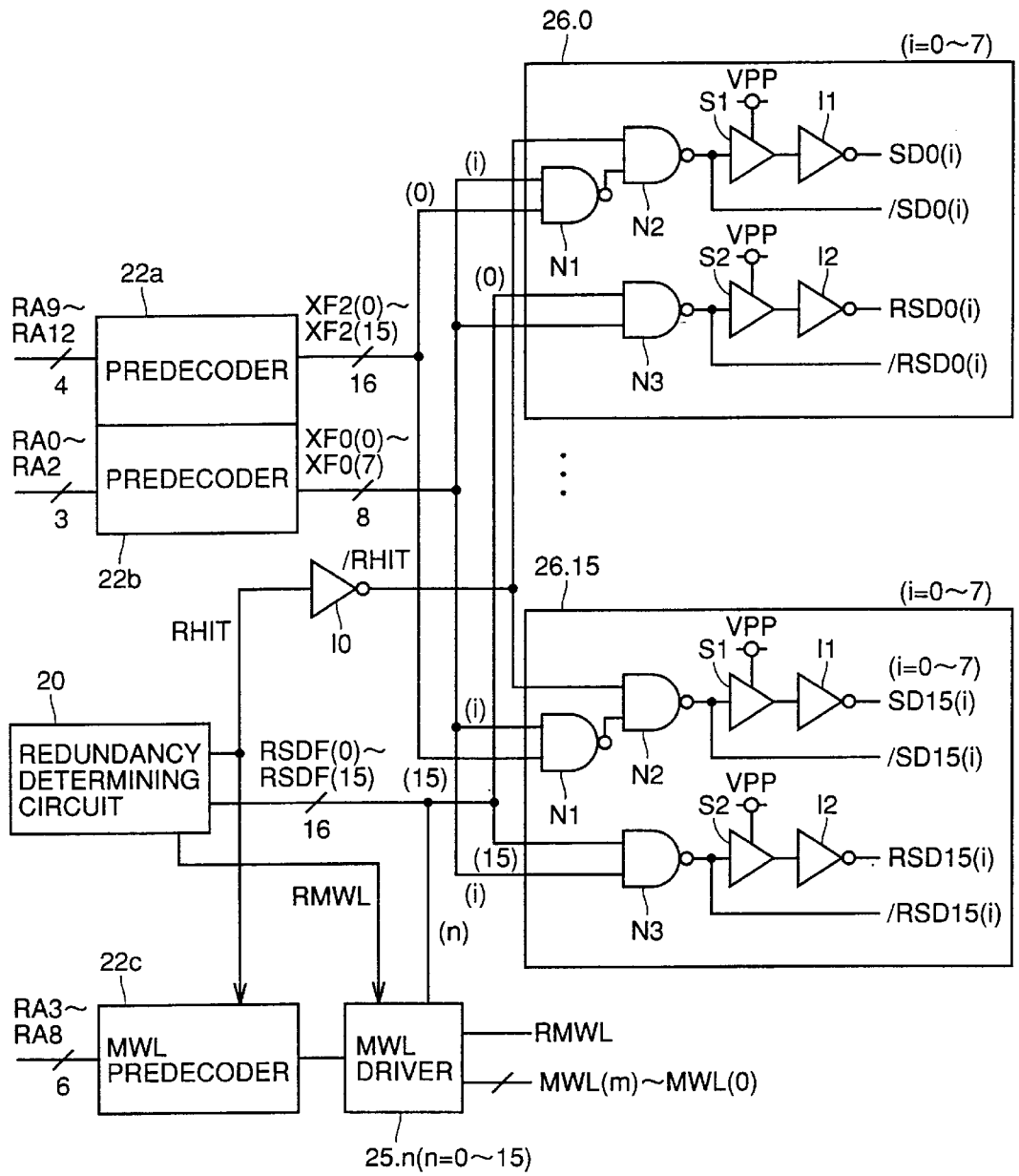
FIG. 3 shows a structure of a main portion of a row address decode circuit 21 in accordance with the first embodiment of the present invention shown in FIG. 1.

Predecoders 22a and 22b and MWL predecoder 22c shown in FIG. 3 are contained in row predecoder 22 shown in FIG. 1. Predecoder 22a outputs a predecode signal XF2 of 16 bits (in the figure, represented by reference characters XF2 (0) to XF2 (15)), in response to an address signal of 4 bits (RA9 to RA12).

Predecoder 22b outputs a predecode signal XF0 of 8 bits (in the figure, represented by the reference characters XF0 (0) to (XF0 (7)), in response to an address signals of 3 bits (RA0 to RA2). MWL predecoder 22c outputs a predecode signal for designating a main word line, in response to determination signal RHIT, based on 6 bits address signal RA3 to RA8.

Figure 4:
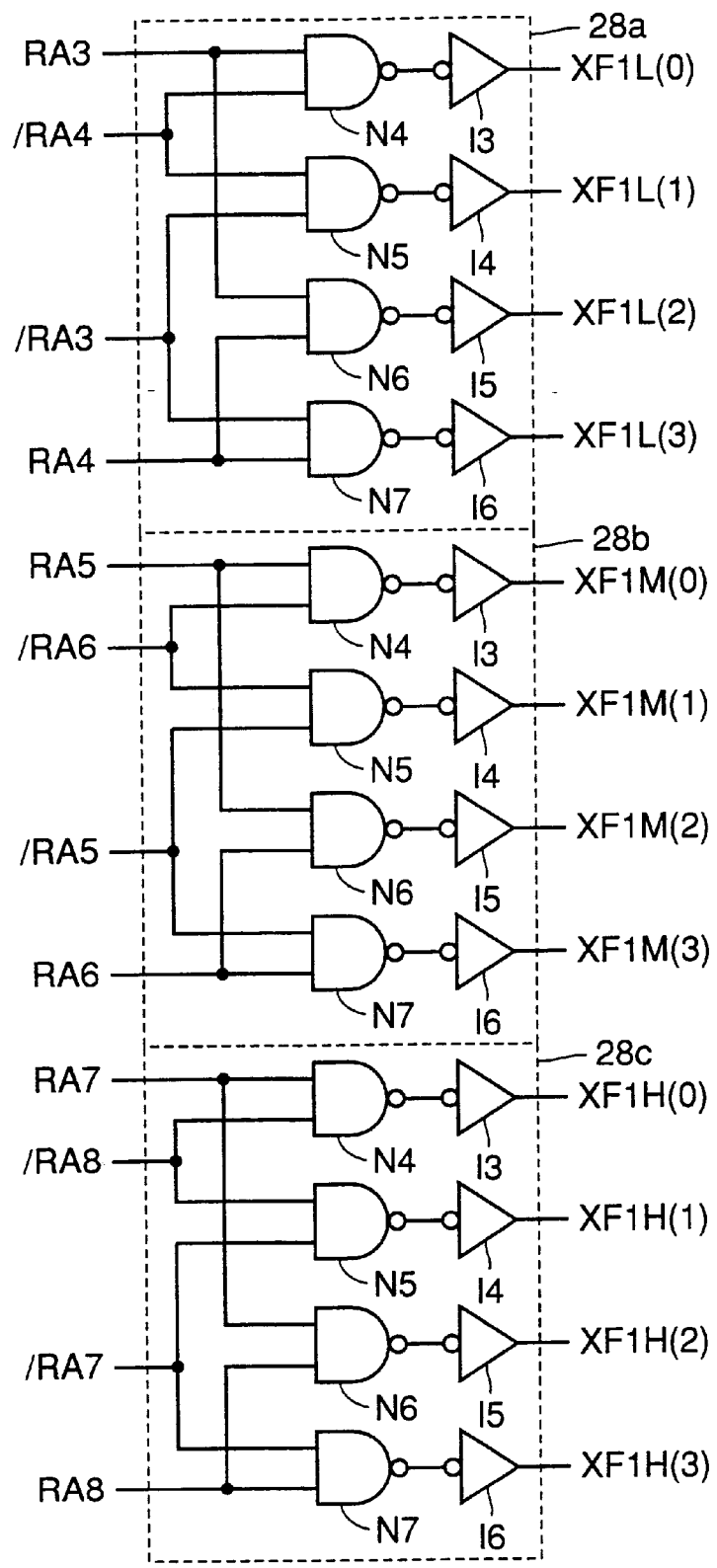
FIG. 4 shows a structure of an MWL predecoder 22c in accordance with the first embodiment of the present invention shown in FIG. 3.

The structure of MWL predecoder 22c in accordance with the first embodiment of the present invention shown in FIG. 3 will be described with reference to FIG. 4.

MWL predecoder 22c includes three sets of decode circuits 28a, 28b and 28c. Decode circuit 28a outputs predecode signals XF1L (0) to (3) in response to address signals RA3, /RA3, RA4 and /RA4. Decode circuit 28b outputs predecode signals XF1M (0) to (3) in response to address signals RA5, /RA5, RA6 and /RA6. Decode circuit 28c outputs predecode signals XF1H (0) to (3) in response to address signals RA7, /RA7, RA8 and /RA8.

Each of decode circuits 28a, 28b and 28c includes NAND circuits N4, N5, NG and N7 as well as inverters I3, I4, I5 and I6.

The structure will be described with decode circuit 28a taken as a representative. NAND circuit N4 receives at each input, address signals RA3 and /RA4. Inverter I3 inverts an output from NAND circuit N4 and outputs predecode signal XF1L (0). NAND circuit N5 receives at its inputs address signals /RA4 and /RA3. Inverter I4 inverts an output from NAND circuit N5 and outputs predecode signal XF1L (1). NAND circuit N6 receives at its input address signals RA3 and RA4. Inverter I5 inverts an output from NAND circuit N6 and outputs predecode signal XF1L (2). NAND circuit N7 receives at its inputs address signals /RA3 and RA4. Inverter I6 inverts an output from NAND circuit N7 and outputs predecode signal XF1L (3).

SD drivers 26.0, . . . of FIG. 3 are included in SD driver/SA driver 24 shown in FIG. 1. SD drivers 26.0, . . . are arranged corresponding to respective memory blocks.

SD drivers 26.0, . . . each include NAND circuits N1 and N2, a level converting circuit S1, and an inverter I1. NAND circuit N1 receives outputs from predecoders 22a and 22b. Inverter I0 inverts determination signal RHIT and outputs a signal /RHIT. NAND circuit N2 receives at one node the signal /RHIT, and at the other end, an output from NAND circuit N1.

NAND circuit N2 outputs a subdecode signal /SD (in the figure, represented by /SD0 (i), . . . :i=0~7) of the corresponding normal block. Inverter I1 receives the output from NAND circuit N2 through level converting circuit S1, and provides a subdecode signal SD (in the figure, represented as SD0 (i), . . . :i=0~7) of the corresponding normal block.

Each of SD drivers 26.0, . . . further includes an NAND circuit N3, a level converting circuit S2 and an inverter I2. NAND circuit N3 receives an output from predecoder 22b and 16 bits of predecode signal RSDF (0) to RSDF (15) output from redundancy determining circuit 20.

NAND circuit N3 outputs redundant subdecode signal /RSD (in the figure, represented by /RSD0 (I), . . . :i=0~7) in the corresponding redundant block. Inverter I2 receives an output from NAND circuit N3 through level converting circuit S2, and outputs a redundant subdecode signal RSD (in the figure, RSD0 (i), . . . i=0~7) in the corresponding redundant block.

The MWL driver 25.n (n=0~15) shown in FIG. 3 corresponds to one memory block, and is contained in MWL driver 25 shown in FIG. 1 together with other MWL drivers corresponding to other memory blocks.

Responsive to an output from MWL predecoder 22c and signals RMWL and predecode signal RSDF (0) to RSDF (15) output from redundancy determining circuit 20, MWL driver 25.n outputs a main word line selecting signal or a redundant main word line selecting signal of the corresponding memory block. Consequently, main word line MWL (0)~MWL (m) or redundant main word line RMWL is set to the selected state.

Figure 5:
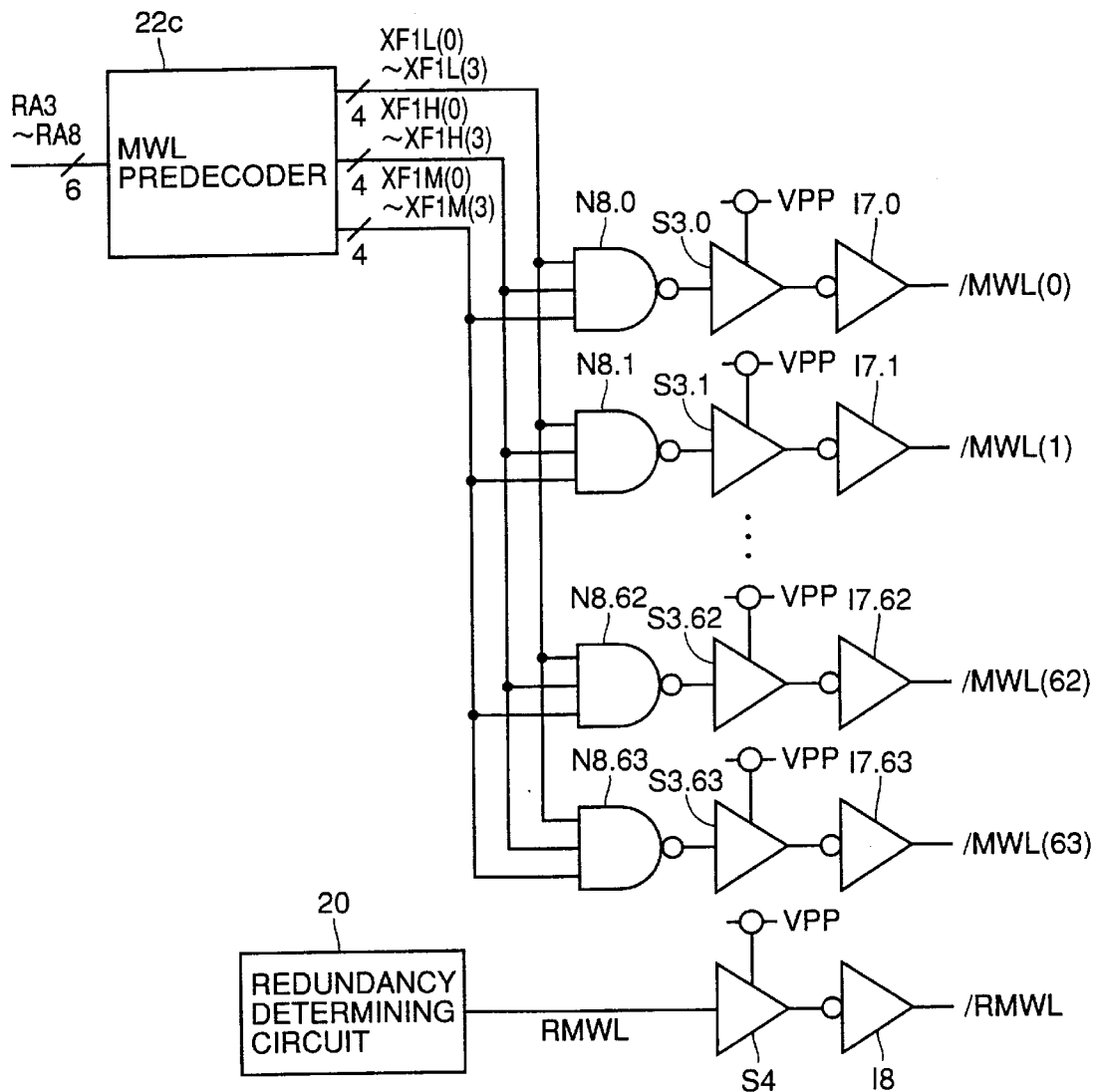
FIG. 5 shows a structure of the MWL driver in accordance with the first embodiment of the present invention.
Figure 6:
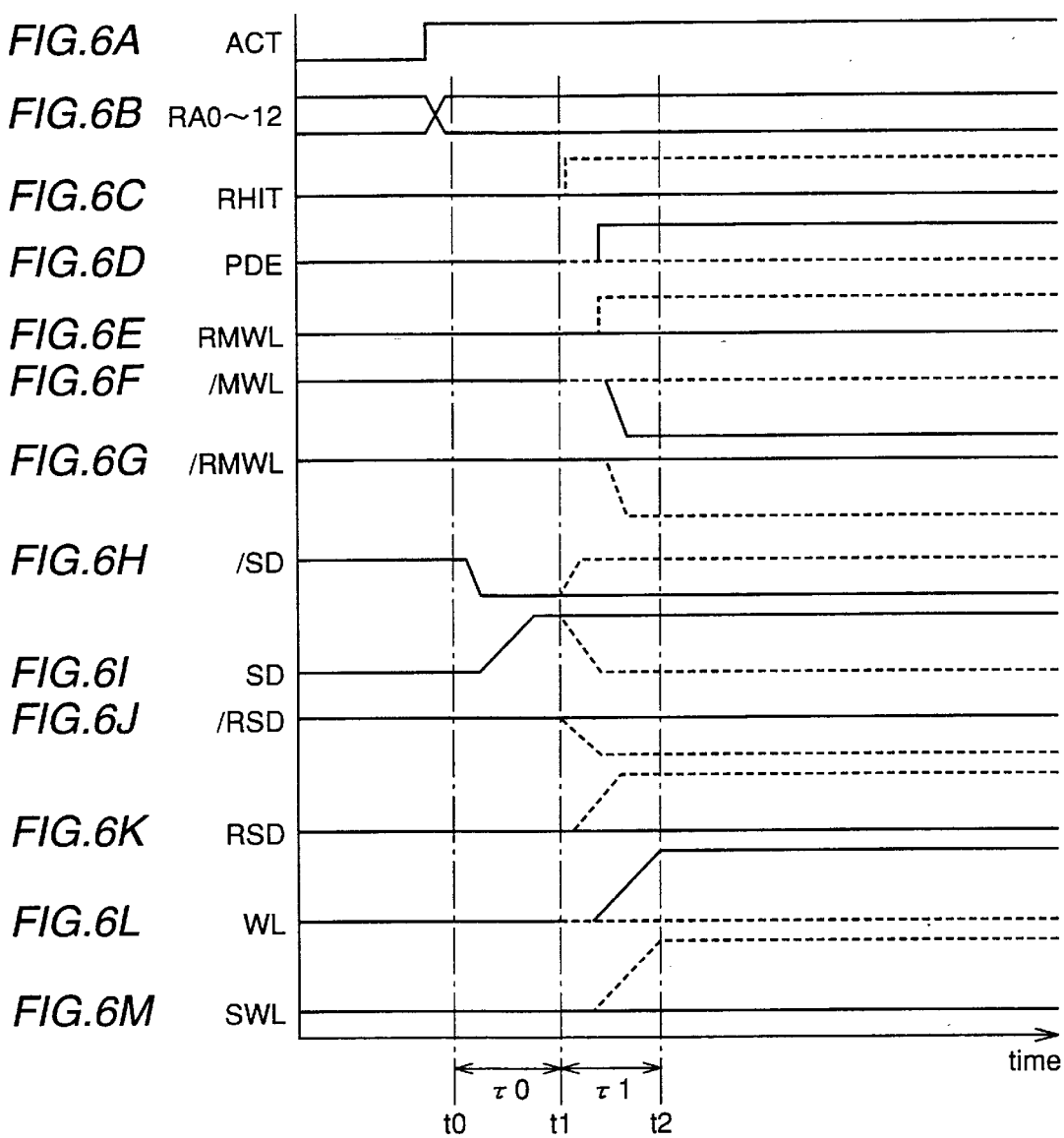
FIGS. 6A to 6M are timing charts related to the operation of semiconductor memory device 1000 in accordance with the first embodiment of the present invention.

A structure of an MWL driver 25.n for one memory block as an alternative will be described with reference to FIG. 5.

MWL driver 25.n includes NAND circuits N8.0m . . . , N8.0, . . . , N8.63, level converting circuits S3.0, . . . , S3.63 and inverters I7.0, . . . , I7.63. Each of NAND circuits N8.0, . . . , N8.63, each of level converting circuits S3.0, . . . , S3.63 and each of inverters I7.0, . . . , I7.63 are arranged corresponding to the main word line.

For example, NAND circuit N8.0 receives corresponding predecode signals XF1L (0)~(3), XF1H (0)~(3), XF1M (0)~(3) from MWL predecoder 22c. Inverter I7.0 receives an output from NAND circuit N8.0 through corresponding level converting circuit S3.0, and provides a main word line selecting signal /MWL (0). Receiving the main word line selecting signal /MWL (0), the corresponding main word line MWL (0) is set to the selected state.

MWL driver 25.n further includes a level converting circuit S4 and an inverter I8. Level converting circuit S4 and inverter I8 are arranged corresponding to the redundant main word line in the redundant block.

Level converting circuit S4 receives the signal RMWL from redundancy determining circuit 20. Inverter I8 inverts an output from the corresponding level converting circuit S4 and outputs redundant main word line selecting signal /RMWL. The corresponding redundant main word line RMWL is set to the selected state upon reception of the redundant main word line selecting signal /RMWL.

Operation of the semiconductor memory device 1000 in accordance with the first embodiment of the present invention will be described with reference to the time chart of FIGS. 6A to 6M.

In response to an external control signal, an activation signal ACT attains to the active state of H level, and a row address signal is taken. At this time point, determination signal RHIT is at L level.

At time t0, any one of predecode signals XF2 and XF0 obtained by predecoding the address signal attains to the H level.

Accordingly, the corresponding subdecode signals SD and /SD are activated, and further, a main word line selecting signal for selecting the corresponding main word line is activated. In this period, redundancy determining circuit 20 is in the state of making redundancy determination.

At time t1, as a result of determination, determination signal RHIT is output. When redundancy is not used, redundancy signal RHIT is kept at the L level (solid line). In this case, the predecode signal RSDF which is an output from redundancy determining circuit 20 is kept at the L level.

When redundancy is to be used, determination signal RHIT rises to the H level (dotted line). Consequently, the subdecode signals SD and /SD which have been activated are inactivated (dotted line). A predecode signal RSFD designating that redundant block in which the substituted spare word line exists, rises to the H level.

Meanwhile, the corresponding redundant subdecode signals RSD and /RSD are activated. Using the activation as a trigger, the redundant main word line selecting signal for selecting the corresponding redundant main word line is activated. By this configuration, if redundancy is not used, activation of the subdecode signal SD for the normal block is completed in the redundancy determining period τ0 from time point t0 to time point t1, and rising of the word line is defined only by the arrival of the main word line selecting signal.

When redundancy is used, the number of redundant word line drivers (driver 4a) is smaller (1:64) than the number of normal word line drivers (driver 4b), and load capacitance applied on the redundancy driver is smaller than that of the normal drivers.

Further, the speed of activation of the redundancy subdecode line is fast, and the speed of rising of the redundant subdecode line is the same or faster that the speed of rising of the main word line. As the main word line has smaller capacitance as compared with the subdecode line, the speed of rising of the word line is faster (τ2 is shorter than τ20 of FIG. 34).

As a result, especially in a semiconductor memory device having a redundant block allowing substitution over memory blocks, the access time can be reduced.

Second Embodiment

The semiconductor memory device in accordance with the second embodiment of the present invention will be described. Semiconductor memory device 1000 in accordance with the first embodiment of the present invention attains high speed of accessing by controlling row access in the normal block separate from row access in the redundant block. In the configuration of the first embodiment, however, the number of lines from SD driver to WL drivers, lines on the WL drivers and the number of SD drivers are increased as compared with the prior art, resulting in larger layout area.

Therefore, in the second embodiment, subdecode signals (both normal and redundant signals) are shared by adjacent memory blocks. This allows higher speed of access and reduced layout area.

The configuration of the main portion of the semiconductor memory device in accordance with the second embodiment of the present invention will be described with reference to FIG. 7.

Figure 7:
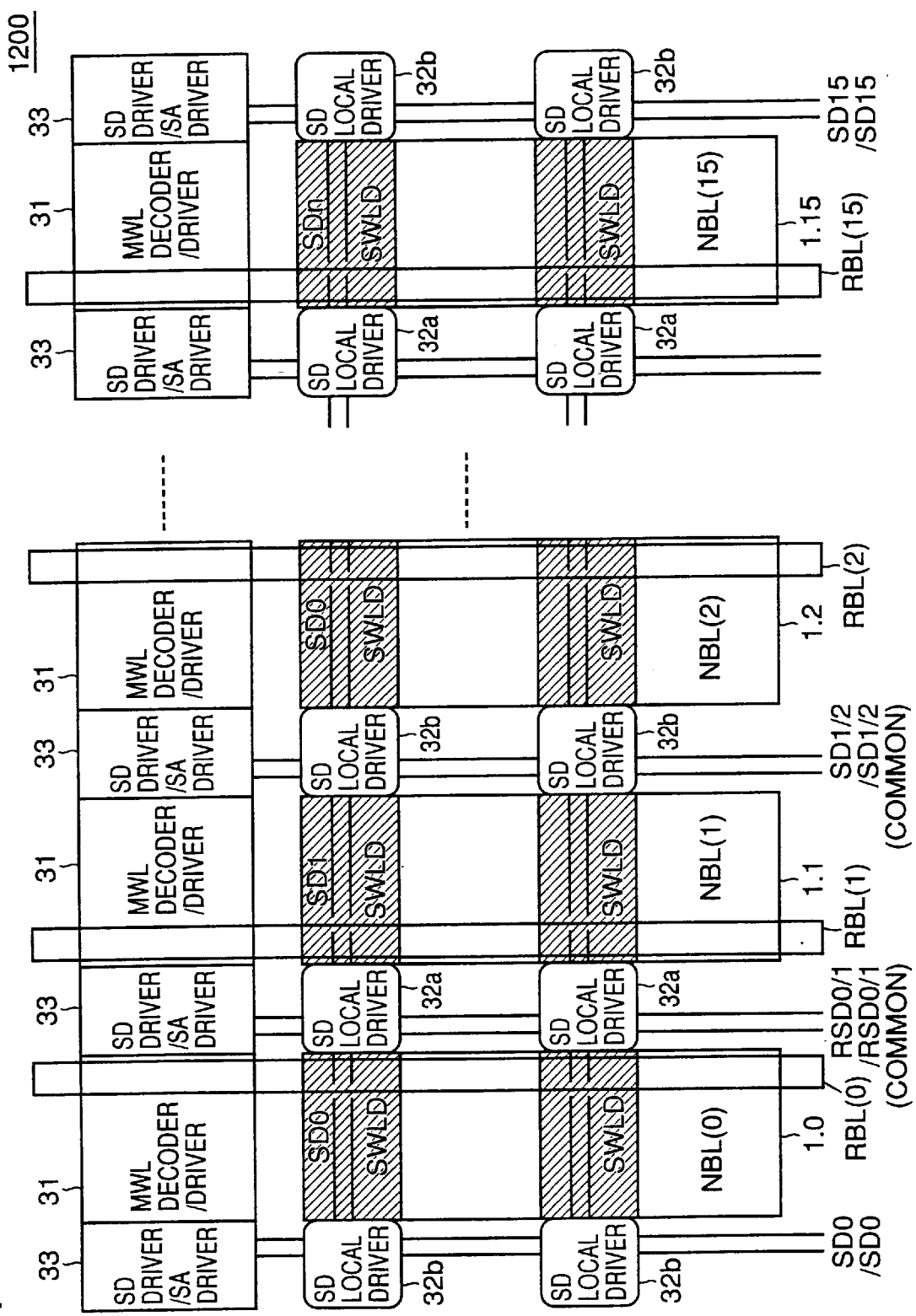
FIG. 7 shows an example of a structure of a main portion of a semiconductor memory device 1200 in accordance with a second embodiment of the present invention.

A semiconductor memory device 1200 shown in FIG. 7 includes a plurality of memory blocks 1.0, . . . , 1.15. An MWL decoder/driver 31 is arranged for each memory block.

On both sides of each of memory blocks 1.0, . . . , sense amplifier blocks, not shown, are arranged. Adjacent memory blocks share the sense amplifier blocks.

Each memory block includes normal block (in the figure, NBL (0), NBL (1), . . .) and redundant block (in the figure RBL (0), RBL (1), . . . ). It is possible to substitute a redundant block existing in one memory block for another memory block.

A redundant block is arranged at an end of the memory block such that adjacent memory blocks has respective redundant blocks opposing to each other with the sense amplifier block placed in between.

An SD local driver 32a for activating the redundant subdecode signal RSD is arranged on a sense amplifier block placed between redundant blocks. An SD local driver 32b for activating the subdecode signal SD for the normal block is arranged on a sense amplifier block placed between normal blocks.

SD local drivers 32a and 32b are arranged respectively corresponding to the redundant blocks or normal blocks positioned on both sides of each driver. More specifically, SD local driver 32a positioned between redundant blocks RBL (0) and RBL (1) is used for activating redundant subdecode signals RSD of these memory blocks. SD local driver 32b positioned between normal blocks NBL (1) and NBL (2) is used for activating the subdecode signals SD for these memory blocks.

SD driver 33 is arranged for each string of SD local drivers 32a and for each string of SD local drivers 32b.

An example of SD local driver configuration in accordance with the second embodiment of the present invention (SD local driver 32b corresponding to the normal blocks in memory blocks 1.1 and 1.2, as well as SD local driver 32a corresponding to redundant blocks in memory blocks 1.0 and 1.1), shown in FIG. 7 will be described with reference to FIG. 8.

For SD local driver, row predecoder 35 and block selecting circuit /SD driver 34 are arranged.

Row predecoder 35 outputs a predecode signal XF2L of 2 bits (in the figure, XF2L (0)~XF2L (1)) in response to 1 bit address signal RA9. Predecode signal XF2L selects one of two memory blocks.

Further, in response to 3 bits of address signals RA10~RA12, row predecoder 35 outputs a predecode signal XF2H of 8 bits (in the figure, XF2H (0)~XF2H (7)) for the normal block. Further, in response to 3 bits of address signals RA0~RA2, row predecoders 35 outputs a predecode signal XF0 of 8 bits (in the figure, XF0(0)~XF0(7)) to the redundant block.

Block selecting circuit/SD driver 34 outputs common subdecode signal SD1/2 (in the figure, SD1/2 (0)~SD1/2 (7)) and inverted signal thereof, that is, /SD1/2 (in the figure, /SD1/2(0)~/SD1/2(7)), in response to predecode signal XF2H.

Block selecting circuit /SD driver 34 outputs common redundant subdecode signal RSD0/1 (in the figure, RSD0/1 (0)~RSD0/1 (7)) and inverted signal thereof, that is, /RSD0/1 (in the figure/RSD0/1 (0)~/RSD0/2 (7)) in response to the predecode signal XF0.

SD local driver 32b includes NAND circuits ND10, N11, N12 and N13. NAND circuit N10 is arranged corresponding to subdecode signals SD1 (0)~SD1 (7) of the normal block NBL (1). NAND circuit N11 is arranged corresponding to subdecode signals SD2 (0)~SD2 (7) of the normal block NBL (2).

NAND circuit N12 is arranged corresponding to subdecode signals /SD1 (0)~SD1 (7) of normal block NBL (1). NAND circuit N13 is arranged corresponding to subdecode signals /SD2 (0)~/SD2 (7) of normal block NBL (2).

NAND circuits N10 and N12 each receive at one input node, predecode signal XF2L (0). NAND circuits N11 and N13 each receive at one input node the predecode signal XF2L (1). NAND circuits N10 and N11 each receive at the other input node, common subdecode signal SD1/2. NAND circuits N12 and N13 each receive at the other input node, common subdecode signal /SD1/2.

Subdecode signals SD1 (0)~SD1 (7) and /SD1 (0)~/SD1 (7) for the normal block NBL (1) are output from NAND circuits N10 and N12, respectively. Subdecode signals SD2 (0)~SD2 (7) and /SD2 (0)~SD2 (7) for the normal block NBL (2) are output from NAND circuits N11 and N13, respectively.

SD local driver 32a includes NAND circuits N14, N15, N16 and N17. NAND circuit N14 is arranged for redundant subdecode signals RSD0 (0)~RSD0 (7) of redundant block RBL (0). NAND circuit N5 is arranged corresponding to redundant subdecode signals RSD1 (0)~RSD1 (7) of redundant block RBL (1). NAND circuit N16 is arranged corresponding to redundant subdecode signals /RSD0 (0)~/RSD0 (7) of redundant block RBL (0). NAND circuit N17 is arranged corresponding to redundant subdecode signals /RSD1 (0)~/RSD1 (7) of redundant block RBL (1).

NAND circuits N14 and N16 each receive at one input node the predecode signal XF2L (0). NAND circuits N15 and N17 each receive at one input node, the predecode signal XF2L (1). NAND circuits N14 and N15 each receive at the other input the common redundant subdecode signal RSD0/1. NAND circuits N16 and N17 each receive at the other input node, the common redundant subdecode signal /RSD0/1.

Redundant subdecode signals RSD0 (0)~RSD0 (7) and /RSD0 (0)~/RSD0 (7) corresponding to the redundant block RBL (0) are output from NAND circuits N14 and N16, respectively. Redundant subdecode signals RSD1 (0) RSD1 (7) and /RSD1 (0)~/RSD1 (7) for the redundant block RBL (1) are output from NAND circuits N15 and N17, respectively.

In this manner, as row access in the normal block and row access in the redundant block are controlled separate from each other, higher speed of accessing is possible.

Further, as the subdecode signals SD and redundant subdecode signals RSD are shared between adjacent memory blocks, layout area can be reduced.

Third Embodiment

A semiconductor memory device in accordance with a third embodiment of the present invention will be described with reference to FIG. 9. The semiconductor memory device in accordance with the third embodiment corresponds to the semiconductor memory device 1200 shown in FIG. 7. In place of SD local drivers 32a and 32b shown in FIGS. 7 and 8, the device includes SD local drivers 36a and 36b shown in FIG. 9.

An example of the configuration of the SD local driver in accordance with the third embodiment of the present invention (SD local driver 36b corresponding to the normal blocks in memory blocks 1.1 and 1.2 and SD local driver 36a corresponding to redundant blocks of memory blocks 1.0 and 1.1) will be described with reference to FIG. 9.

A row predecoder 35 and a block selecting circuits /SD driver 34 are arranged for the SD local driver.

As already described, row predecoder 35 outputs predecode signal XF2L of 2 bits (in the figure, XF2L (0)~XF2L (1)), predecode signal XF2H of 8 bits (in the figure, XF2H (0)~SF2H (7)) and precoded signal XF0 of 8 bits (in the figure, XF0 (0)~XF0 (7)).

Block selecting circuit /SD driver 34 outputs common subdecode signal SD1/2 (in the figure, SD1/2 (0)~SD1/2 (7)) and inverted signal thereof, /SD1/2 (in the figure, /SD1/2 (0)~/SD1/2 (7)) as well as common redundant subdecode signal RSD0/1 (in the figure, RSD0/1 (0)~RSD1/1 (7)) and inverted signal thereof /RSD0/1 (in the figure, /RSD0/1 (0)~/RSD0/1 (7)).

Figure 8:
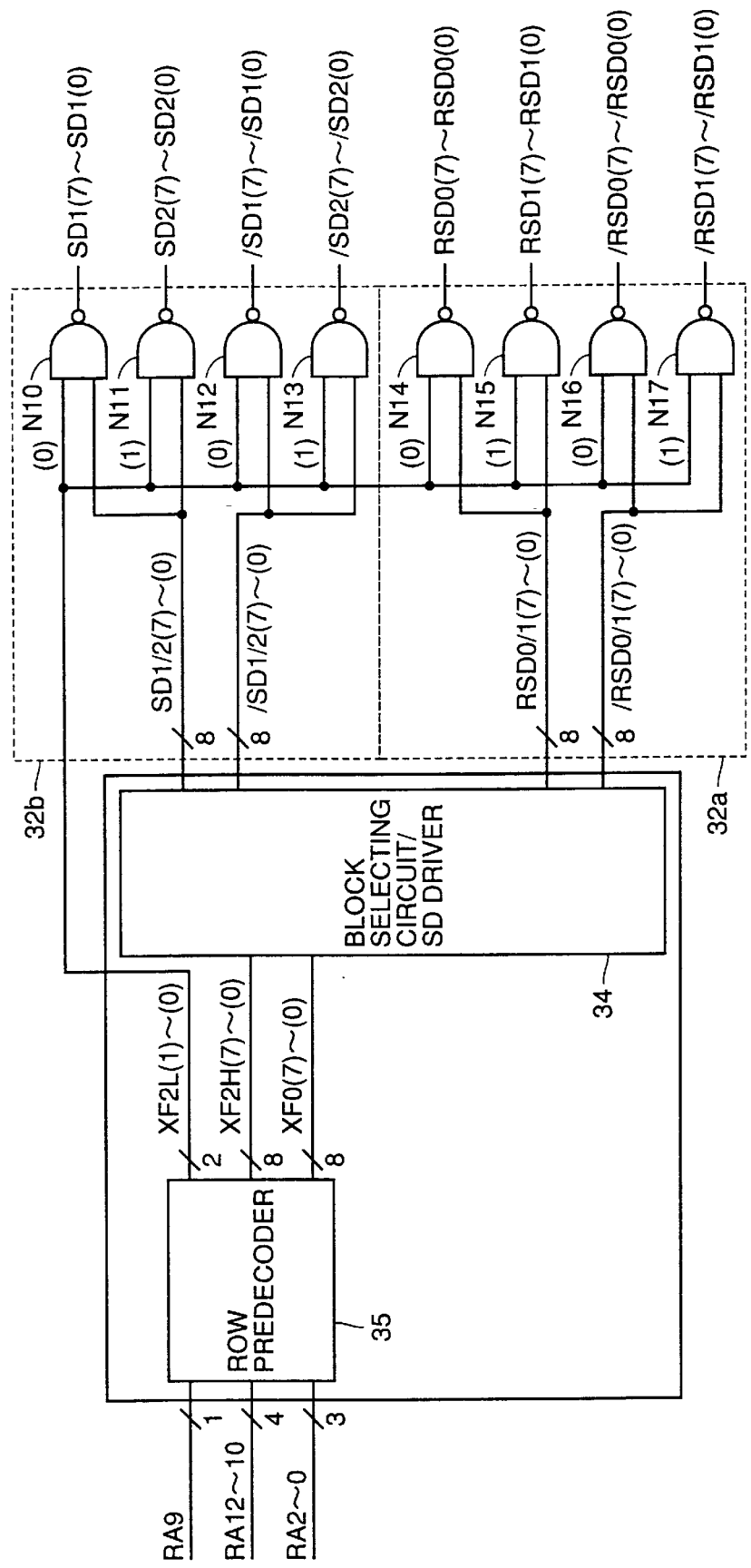
FIG. 8 shows an example of a structure of an SD local driver in accordance with the second embodiment of the present invention shown in FIG. 7.
Figure 9:
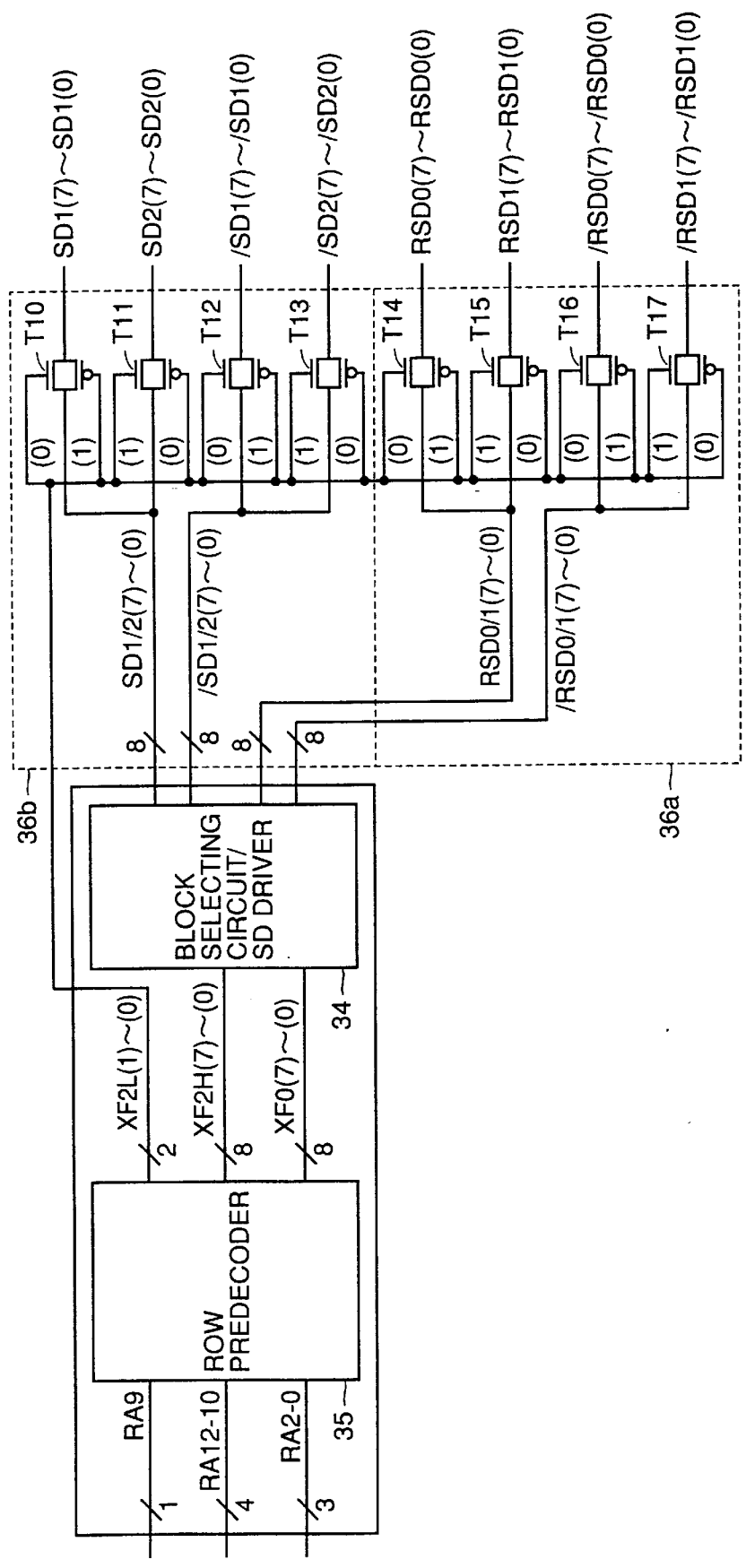
FIG. 9 shows an example of a structure of the SD local driver in accordance with a third embodiment of the present invention.

SD local driver 36b includes, in place of NAND circuits N10, N11, N12 and N13 shown in FIG. 8, transfer gates T10, T11, T12 and T13.

Transfer gates T10 and T12 are rendered conductive in response to predecode signal XF2L (0) at the H level. Transfer gates T11 and T13 are rendered conductive in response to the predecode signal XF2L (1) at the H level.

Transfer gates T10 and T11 receive, each at one conduction terminal, the common subdecode signal SD1/2. Transfer gates T12 and T13 each receive, at one conduction terminal, the common subdecode signal /SD1/2.

Subdecode signals SD1 (0)~SD1 (7) and subdecode signals /SD1 (0)~/SD1 (7) for normal block NBL (1) of memory block 1.1 are output from the other conduction terminal of each of transfer gates T10 and T12, respectively. Subdecode signals SD2 (0)~SD2 (7), and /SD2 (0)~/SD2 (7) for normal block NBL (2) of memory block 1.2 are output from the other conduction terminal of each of transfer gates T11 and T13, respectively.

SD local driver 36a includes, in place of NAND circuits N14, N15, N16 and N17 shown in FIG. 8, transfer gates T14, T15, T16 and T17.

Transfer gates T14 and T16 are rendered conductive in response to predecode signal XF2L (0) at the H level. Transfer gates T15 and T17 are rendered conductive in response to predecode signal XF2L (1) at the H level.

Transfer gates T14 and T15 receive each at one conduction terminal, common redundant subdecode signal RSD0/1. Transfer gates T16 and T17 each receive at one conduction terminal, common redundant subdecode signal /RSD0/1.

Transfer gates T14 and T15 output, each from the other conduction terminal, redundant subdecode signals RSD0 (0)~RSD0 (7) and /RSD0 (0)~/RSD0 (7) for redundant block RBL (0), respectively. Transfer gates T15 and T17 output, each from the other conduction terminal, redundant subdecode signals RSD1 (0)~RSD1 (7) and /RSD1 (0)~/RSD1 (7) for redundant block RBL (1), respectively.

In this manner, row access in the normal block and row access in the redundant block are controlled separately, and higher speed of access is possible. Further, as decoders are shared by adjacent memory blocks, layout area can be reduced.

Further, the SD local decoder is constituted by transfer gates having smaller number of components than NAND circuit having larger number of components, the layout area can further be reduced from the second embodiment of the present invention.

Fourth Embodiment

A semiconductor memory device in accordance with a fourth embodiment of the present invention will be described. The semiconductor memory device in accordance with the fourth embodiment further reduces access time, by controlling the sense amplifier system separately from the redundancy system, in addition to activation of subdecode signals for the normal block.

The semiconductor memory device in accordance with the fourth embodiment of the present invention will be described with reference to FIG. 10. Components similar to those of semiconductor memory devices 1000 and 1200 are denoted by the same reference characters and description thereof is not repeated.

Figure 10:
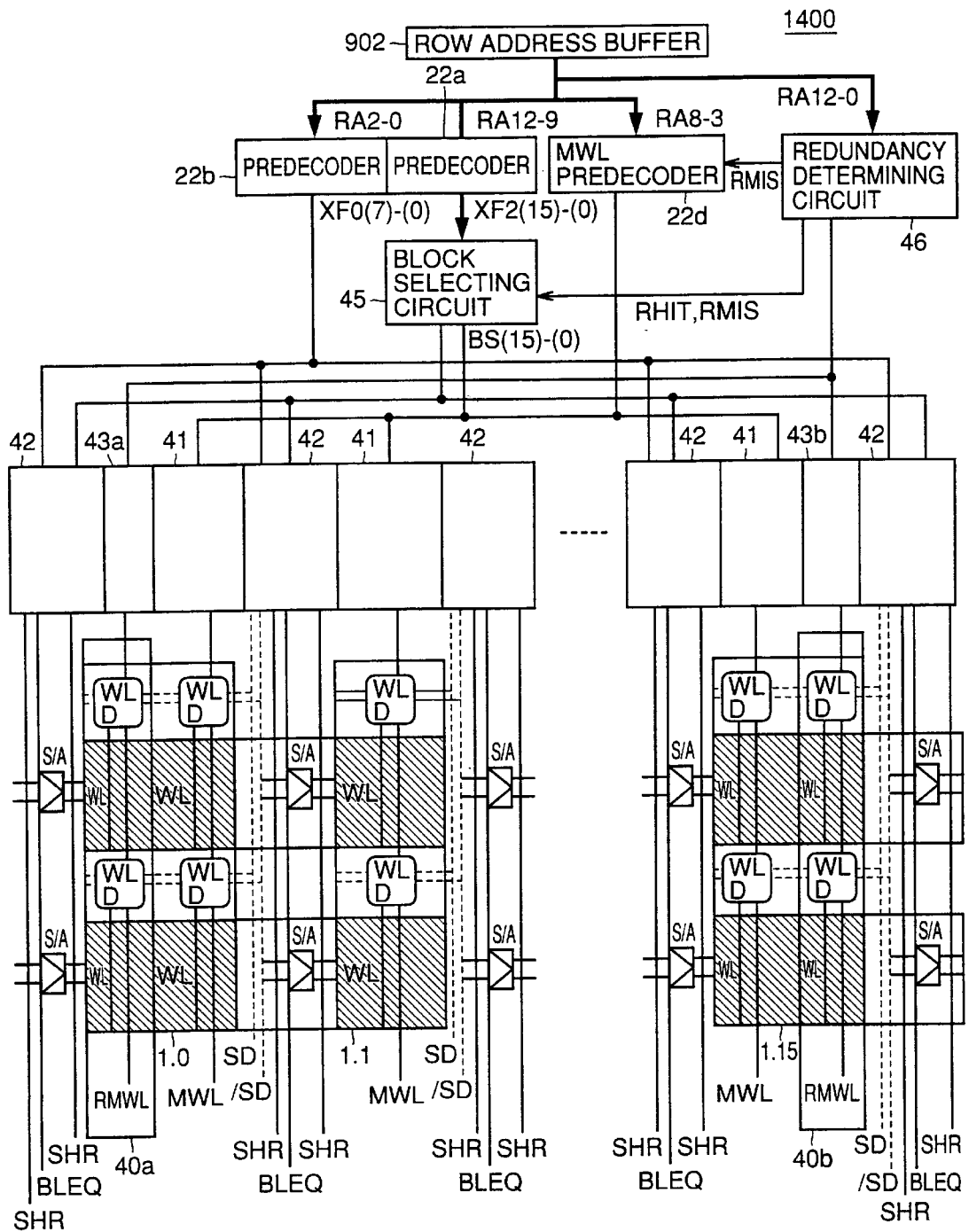
FIG. 10 shows an example of an overall structure of a semiconductor memory device 1400 in accordance with a fourth embodiment of the present invention.

Semiconductor device 1400 shown in FIG. 10 includes row address buffer 902, predecoders 22a and 22b, MWL predecoder 22b, block selecting circuit 45, redundancy determining circuit 46 and a plurality of memory blocks 1.0, . . . , 1.15.

Sense amplifiers S/A are arranged on areas on both sides of memory blocks 1.0, . . . . Adjacent memory blocks share sense amplifiers S/A. Corresponding to a sense amplifier block containing a plurality of sense amplifiers S/A, an SD driver/S/A band control signal driver 42 is arranged. S/A band control signal driver portion of SD driver/S/A band control signal driver 42 outputs a shared gate signal for separating non-selected memory blocks and an equalize signal for equalizing bit line pair. SD driver portion of SD driver/S/A band control signal driver 42 activates the subdecode signal.

MWL decoder/driver 41 is arranged for each of memory blocks 1.0, . . . . In FIG. 1, reference character WLD represents a WL driver.

Memory blocks 1.0 and 1.15 at opposing ends of the arrangement of memory blocks 1.0 include redundant blocks 40a and 40b. Other memory blocks 1.1, . . . , 1.14 do not include any redundant block. Memory blocks 1.1, . . . , 1.14 include normal blocks NBL (1), NBL (2), . . . , respectively.

Redundant RMWL drivers 43a and 43b are arranged corresponding to redundant blocks 40a and 40b, respectively.

In the fourth embodiment of the present invention, redundant blocks, which have been arranged dispersed in respective blocks are arranged collectively at two portions. Spare word line SWL is activated only when the redundant main word line is activated.

Redundancy determining circuit 46 outputs two determination signals RHIT and RMIS, in accordance with address signals RA0 to RA12. Determination signals RHIT and RMIS are at the L level in the initial state. When it is determined that redundancy is not used, determination signal RMIS attains to the H level, and when it is determined that redundancy is used, determination signal RHIT attains to the H level. MWL predecoder 22d outputs a predecode signal in response to determination signal RMIS.

Block selecting circuit 45 outputs block selecting signals BS (0)~BS (15) based on predecode signal XF2 (in the figure, XF2 (0)~XF2 (15)) received from predecoder 22a, in response to determination signals RHIT and RMIS.

An example of the configuration of block selecting circuit 45 in accordance with the fourth embodiment of the present invention shown in FIG. 10 will be described with reference to FIG. 11. Block selecting circuit 45 includes inverters I10, I11 and I12.

Inverter I10 outputs a signal /RHIT obtained by inverting determination signal RHIT. Inverter I11 outputs a signal /RMIS obtained by inverting the signal RMIS. Inverter I12 outputs an address signal /RA12 obtained by inverting address signal RA12.

As will be described later, address signals RA12 and /RA12 are used for activating memory block 1.15 for memory blocks 1.0 to 1.7, and used for activating memory block 1.0 for memory blocks 1.8 to 1.15.

Figure 11:
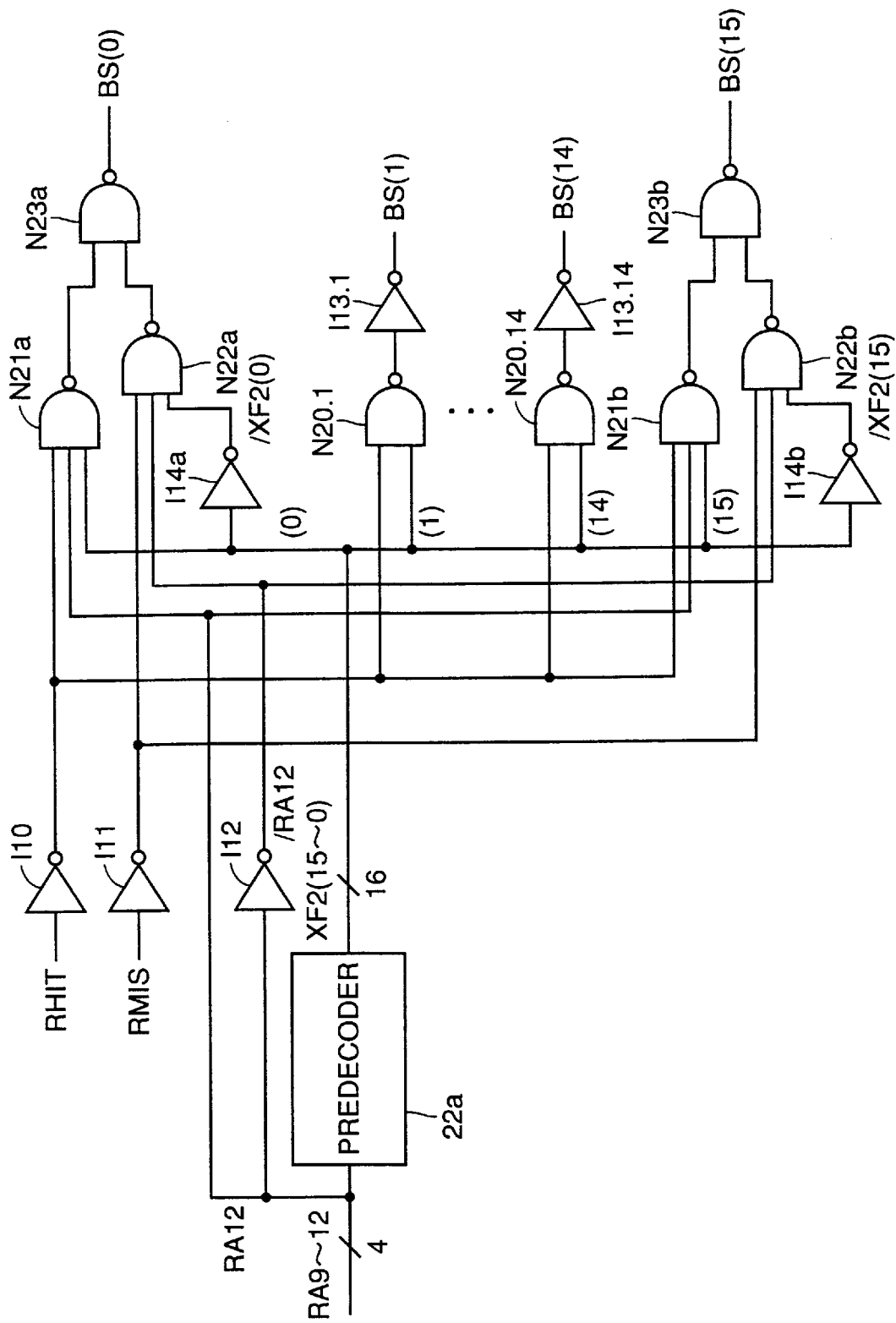
FIG. 11 shows an example of a structure of a block selection circuit 45 in accordance with the fourth embodiment of the present invention shown in FIG. 10.

In block selecting circuit 45 shown in FIG. 11, NAND circuits N20.1, . . . , N20.14 and inverters I13.1, . . . ,I13.14 are arranged for the memory blocks not having the redundant block.

NAND circuits N20.1, . . . , N20.14 receive, at respective input nodes, predecode signals XF2 (1)~(14) output from predecoder 22a, respectively. NAND circuits N20.1, . . . , N20.14 receive at respective input nodes the signal /RHIT. Inverters I13.1, . . . , I13.14 invert outputs from NAND circuits N20.1, . . . , N20.14, respectively. Inverters I13.1, . . . , I13.14 output block selecting signals BS (1), . . . , BS (14), respectively.

In block selecting circuit 45, for memory block 1.0 having redundant block 40a, NAND circuits N21a, N22a and N23a as well as inverter I14a are arranged. Inverter I14a outputs a signal JXF2 (0) obtained by inverting predecode signal XF2 (0).

NAND circuit N21a receives at its input the signal /RHIT, address signal RA12 and predecode signal XF2 (0). NAND circuit N22a receives at its input the signal /RMIS, address signal /RA12 and signal /XF2 (0).

NAND circuit N23a receives outputs from NAND circuits N21a and N22a, and outputs a block selecting signal BS (0) corresponding to the memory block 1.0.

In the block selecting circuit 45, for the memory block 1.15 having redundant block 40b, NAND circuits N21b, N22b and N23b and an inverter I14b are arranged. Inverter I14b outputs a signal /XF2 (15) obtained by inverting predecode signal XF2 (15).

NAND circuit N21b receives at its input the signal /RHIT, address signal RA12 and predecode signal XF2 (15). NAND circuit N22b receives at its input the signal /RMIS, address signal /RA12 and the signal /XF2 (15).

NAND circuit N23b receives outputs from NAND circuits N21b and N22b, and outputs a block selecting signal BS (15) corresponding to memory block 1.15.

Configuration of the SD driver in accordance with the fourth embodiment of the present invention shown in FIG. 10 will be described with reference to FIG. 12. The configuration shown in FIG. 12 is included in the SD driveruS/A band control signal driver 42.

Figure 12:
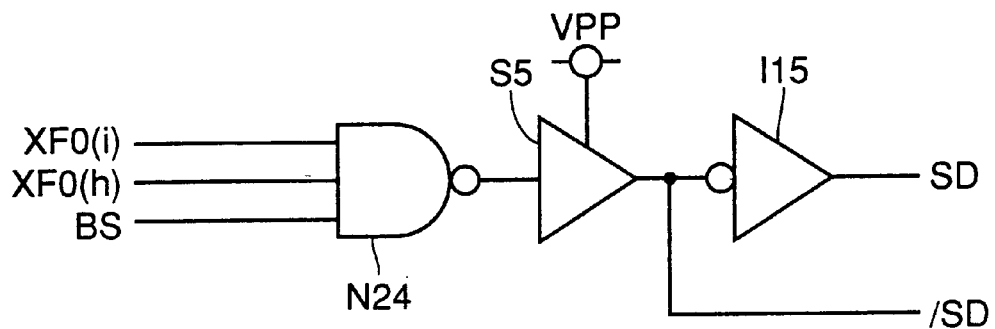
FIG. 12 shows an example of a structure of the SD driver in accordance with the fourth embodiment of the present invention shown in FIG. 10.

The SD driver shown in FIG. 12 includes an NAND circuit N24, level converting circuit S5 and an inverter I5. NAND circuit N24 receives at its input predecode signals XF0 (i) and XF0 (h) (i, h=0, 1, . . . .) output from predecoder 22b, and corresponding block selecting signal BS. Level converting circuit S5 receives an output from NAND circuit N24 and outputs a corresponding subdecode signal /SD. Inverter I15 receives an output from level converting circuit S5 and outputs a corresponding subdecode signal SD.

The exemplary configuration of the MWL driver in accordance with the fourth embodiment of the present invention shown in FIG. 10 will be described with reference to FIG. 13.

Basic configuration of MWL predecoder 22d is the same as that of MWL predecoder 22c. MWL predecoder 22d outputs predecode signals XF1L (0)~XF1L (3), predecode signals XF1M (0)~XF1M (3) and predecode signals XF1H (0)~XF1H (3), in response to address signals RA3~RA8.

Figure 13:
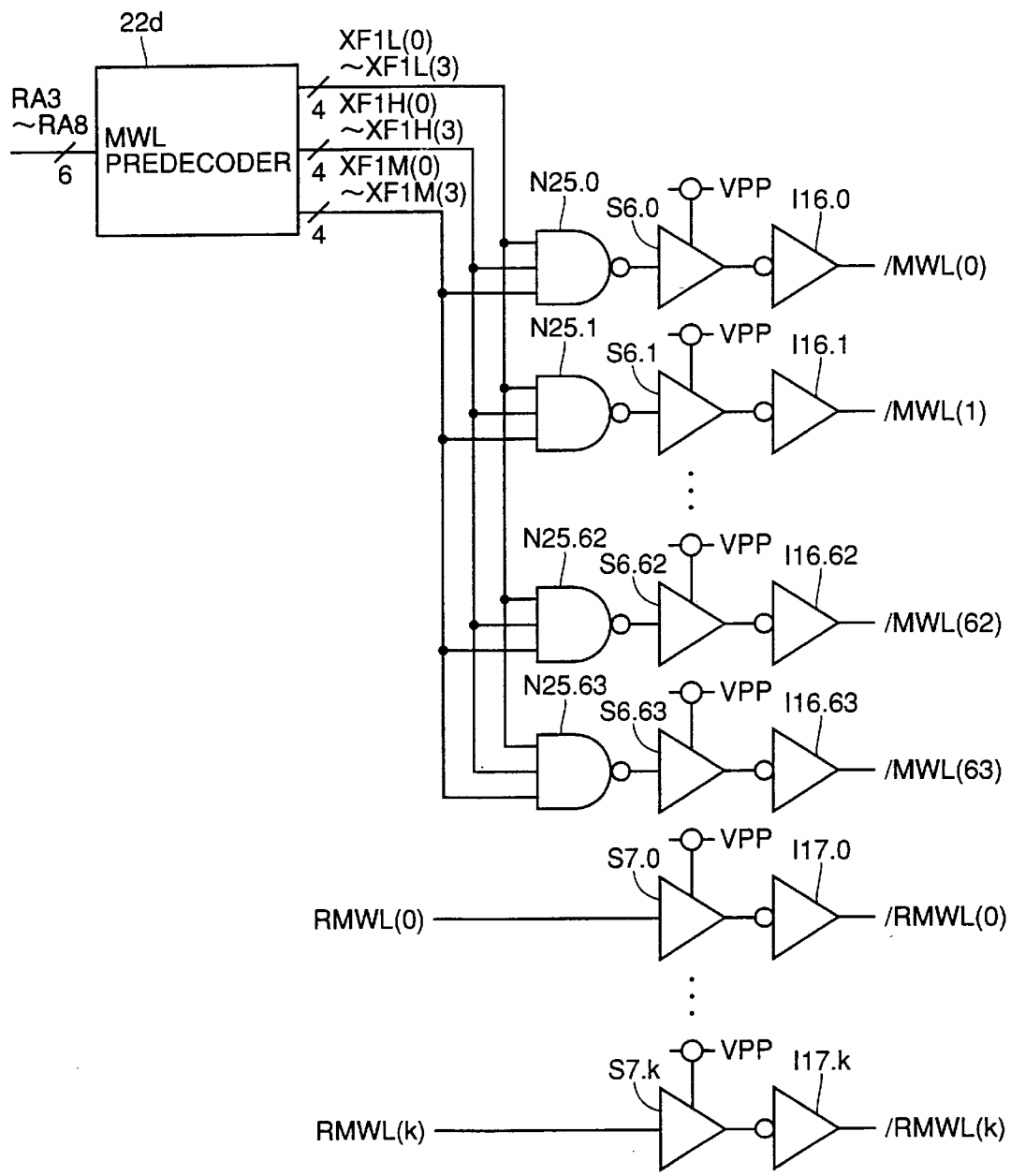
FIG. 13 shows an example of a structure of the MDWL driver in accordance with the fourth embodiment of the present invention shown in FIG. 10.

The MWL driver shown in FIG. 13 includes NAND circuits N25.0, . . . , N25.63, level converting circuits S6.0, . . . , S6.63 and inverters I16.0, . . . , I16.63. NAND circuits N25.0, . . . , N25.63, level converting circuits S6.0, . . . , S6.63 and inverters I16.0, . . . , I16.63 are arranged corresponding to main word lines of normal blocks, respectively.

For example, NAND circuit N25.0 receives corresponding predecode signals XF1L (0)~XF1L (3), XF1H (0)~XF1H (3) and XF1M (0)~XF1M (3) from MWL predecoder 22d. Inverter I16.0 receives an output from NAND circuit N25.0 through corresponding level converting circuit S6.0 and outputs a corresponding main word line selecting signal /MWL (0).

MWL driver shown in FIG. 13 further includes level converting circuits S7.0, . . . S7.k and inverters I17.0, . . . , I17.k. Level converting circuits S7.0, . . . , S7.k and inverters I17.0, . . . , I17.k are arranged corresponding to redundant main word lines RMWL (0), . . . , RMWL (k), respectively.

For example, level converting circuit S7.0 receives the signal RMWL (0) output from redundancy determining circuit 46. Inverter I17.0 inverts an output from the corresponding level converting circuit S7.0, and outputs a corresponding redundant main word line selecting signals /RMWL (0).

Configuration of S/A band control signal driver in accordance with the fourth embodiment of the present invention shown in FIG. 10 will be described with reference to FIG. 14. The configuration shown in FIG. 14 is contained in SD driveruS/A band control signal driver 42 shown in FIG. 10.

Figure 14:
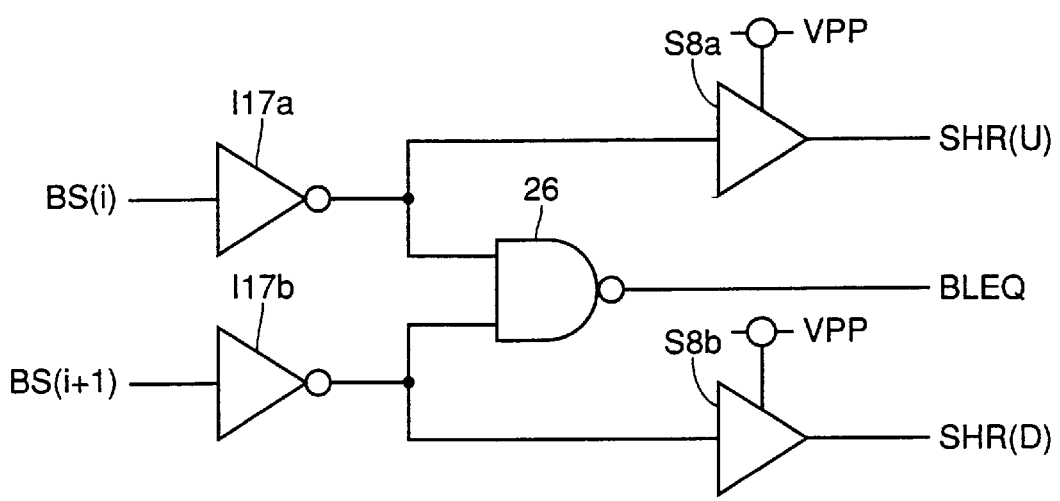
FIG. 14 shows an S/A band control signal driver in accordance with the fourth embodiment of the present invention shown in FIG. 10.

S/A band control driver shown in FIG. 14 includes an NAND circuit N26, level converting circuits S8a and S8b, and inverters I17a and I17b.

Inverter I17a inverts the corresponding block selecting signal BS (i) and outputs the resulting signal. Inverter I17b inverts the block selecting signal BS (i+1) corresponding to an adjacent memory block, and outputs the resulting signal. NAND circuit N26 receives output from inverters I17a and I17b. A corresponding equalize signal BLEQ is output from NAND circuit N26.

Level converting circuit S8a receives an output from inverter I17a and outputs one shared gate signal SHR (U). Level converting circuit S8b receives an output from inverter I17b and outputs the other shared gate signal SHR (D). When a memory block is selected, a shared gate signal for separating non-selected memory block side, and equalize signal BLEQ for equalizing bit line pairs are inactivated, regardless of the result of redundancy determination.

The operation of the semiconductor memory device in accordance with the fourth embodiment of the present invention will be described with reference to the timing charts of FIGS. 15A to 15R.

In response to an external control signal, activation signal ACT attains to the active state of H level, and a row address signal is taken. At this time point, determination signals RHIT and RMIS are both at the L level.

Assume that a memory block 1.2 not having a redundant block is selected. At time point t0, as the row system is rendered active by the activation signal ACT (at T0), corresponding subdecode signals SD and /SD are activated, while shared gate signal SHR and equalize signal BLEQ are inactivated. In a redundant block also, corresponding redundant subdecode signals RSD and /RSD are activated, while shared gate signal SHR and equalize signal BLEQ are inactivated.

In the period from time point t0 to time point t1, redundancy determining circuit 46 determines whether redundancy is to be used or not. At time t1, as a result of determination, determination signals RHIT, RMIS and redundant main word lines selecting signals /RML (0)~(k) are output.

The redundant main word line selecting signal is for selecting a corresponding redundant main word line, and it is always at the L level in the initial state.

When redundancy is not used, determination signal RMIS attains to the H level (solid line). As the determination signal RMIS rises to the H level, selection of memory blocks 1.0 and 1.15 is canceled, and subdecode signals SD and /SD, which have been activated, are inactivated. Shared gate signal SHR and equalize signal BLEQ are inactivated.

As determination signal RMIS rises to the H level, any one of the predecode signals output from MWL predecoder 22d rises from the L level to the H level. Consequently, the corresponding main word line selecting signal is activated, and a word line WL in the normal block is set to the selected state.

When redundancy is to be used, determination signal RHIT attains to the H level (dotted line). The redundant main word line selecting signal to be used as a substitute is activated (H level).

As determination signal RHIT rises to the H level, memory block 1.2 which has been selected by the row address is set to non-selected state. At the same time, one redundant main word line selecting signal is activated. A corresponding spare word line SWL is set to the selected state.

In this manner, in the determination period τ0 from time point t0 to time point t1, subdecode signal SD of the normal block is activated, and shared gate signal and the like controlling activation of sense amplifier and the like are inactivated. Therefore, in the following time period τ1 from t1 to t2, what is necessary is that the main word line is lowered and the word line is raised. Therefore, the time necessary for the lise of the word line can be reduced.

Figure 16:
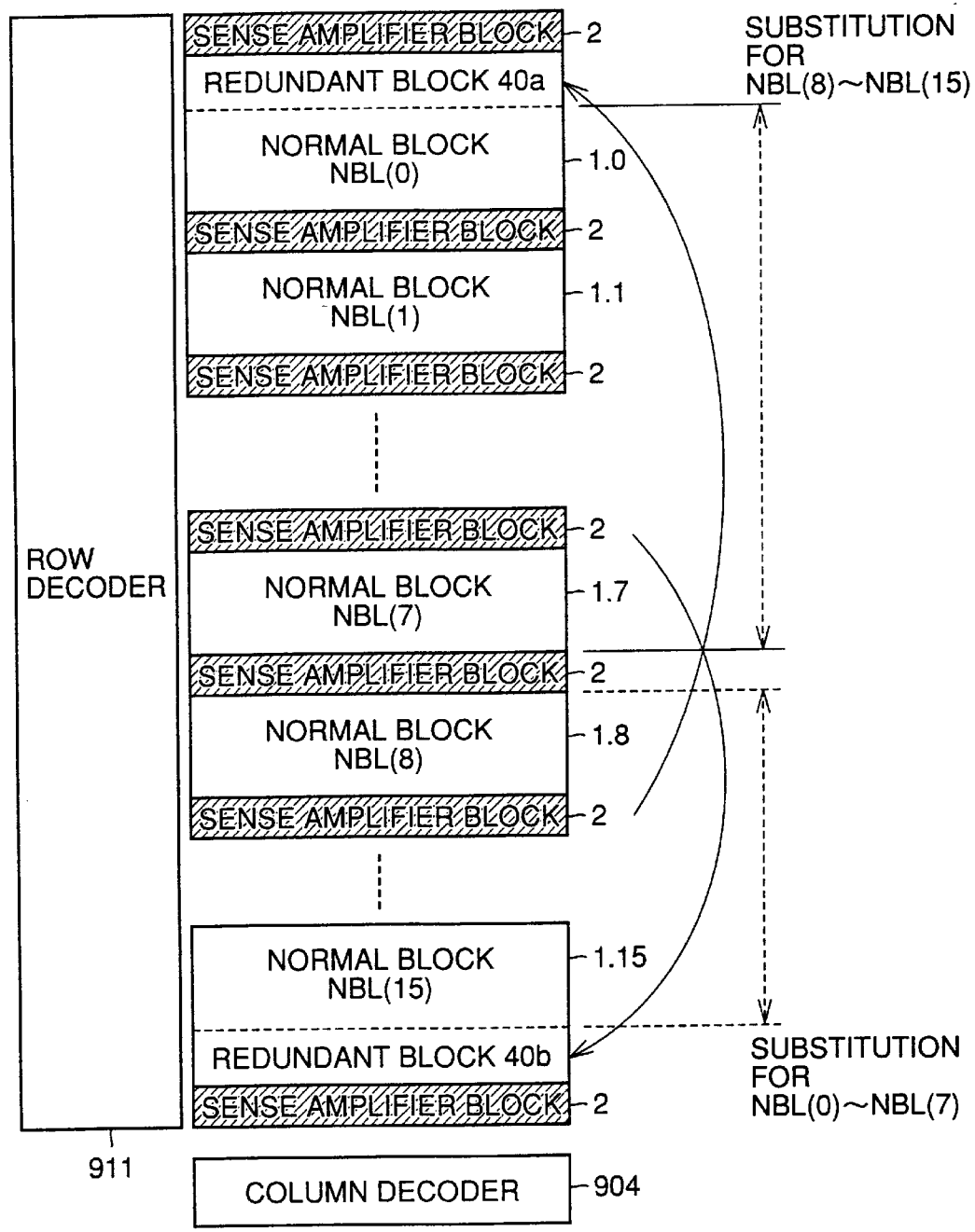
FIG. 16 shows substitution in the fourth embodiment of the present invention.

Substitution in accordance with the fourth embodiment of the present invention will be described with reference to FIG. 16. Referring to FIG. 16, in semiconductor memory device 1400, for normal blocks NBL (0)~NBL (7), a redundant block 40b positioned at memory block 1.15 is used, and for normal blocks NBL (8)~NBL (15), redundant block 40a positioned at memory block 1.0 is used. The reason for this is that when substitution is done by an adjacent memory block, it becomes necessary to once inactivate the shared gate signal SHR of the sense amplifier block placed between two memory blocks and again to activate the shared gate signal before the rise of the word line after redundancy determination. Time necessary for the rise of the word line through this operation is considerably long.

Figure 17:
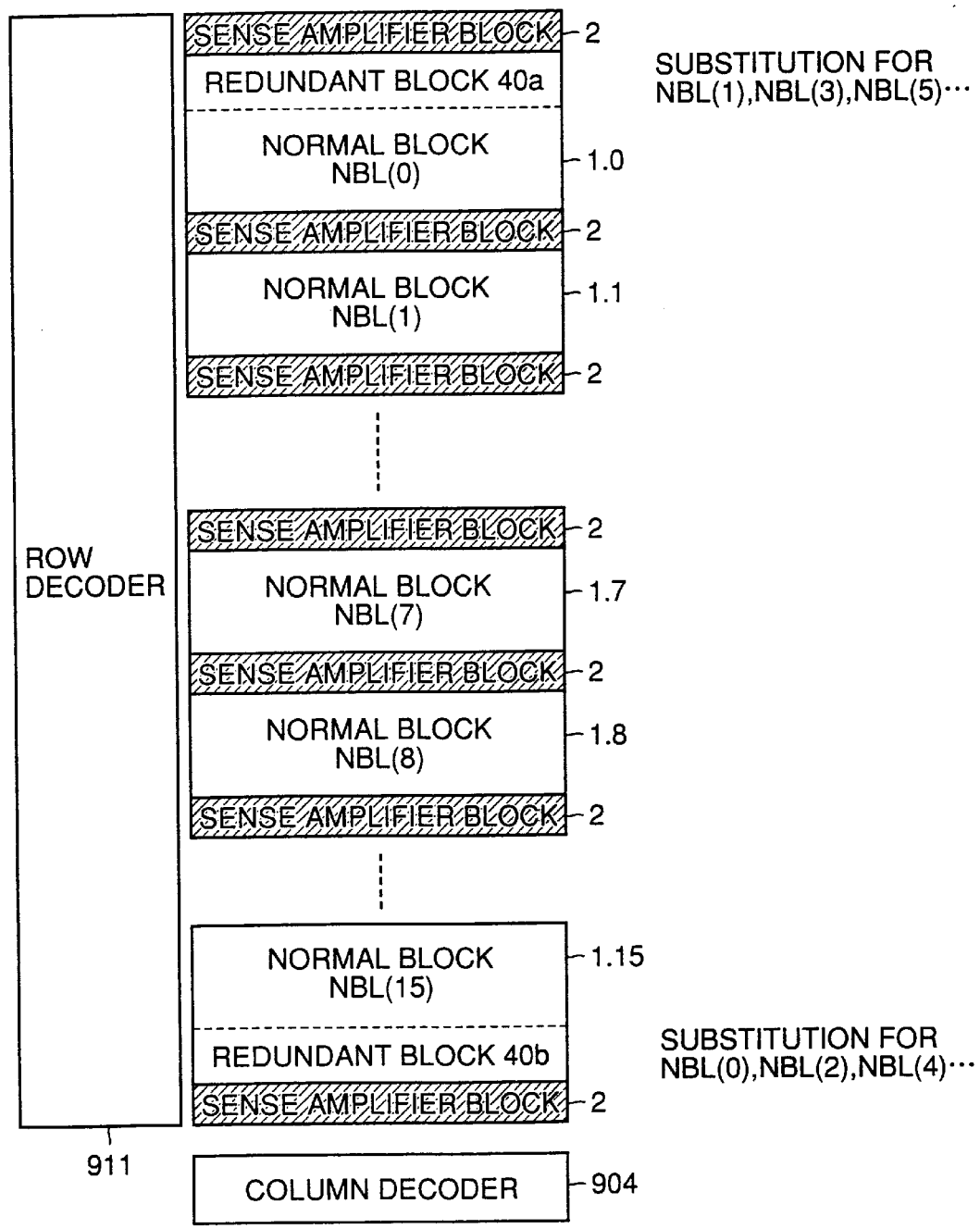
FIG. 17 shows another example of substitution in the fourth embodiment of the present invention.
Figure 18:
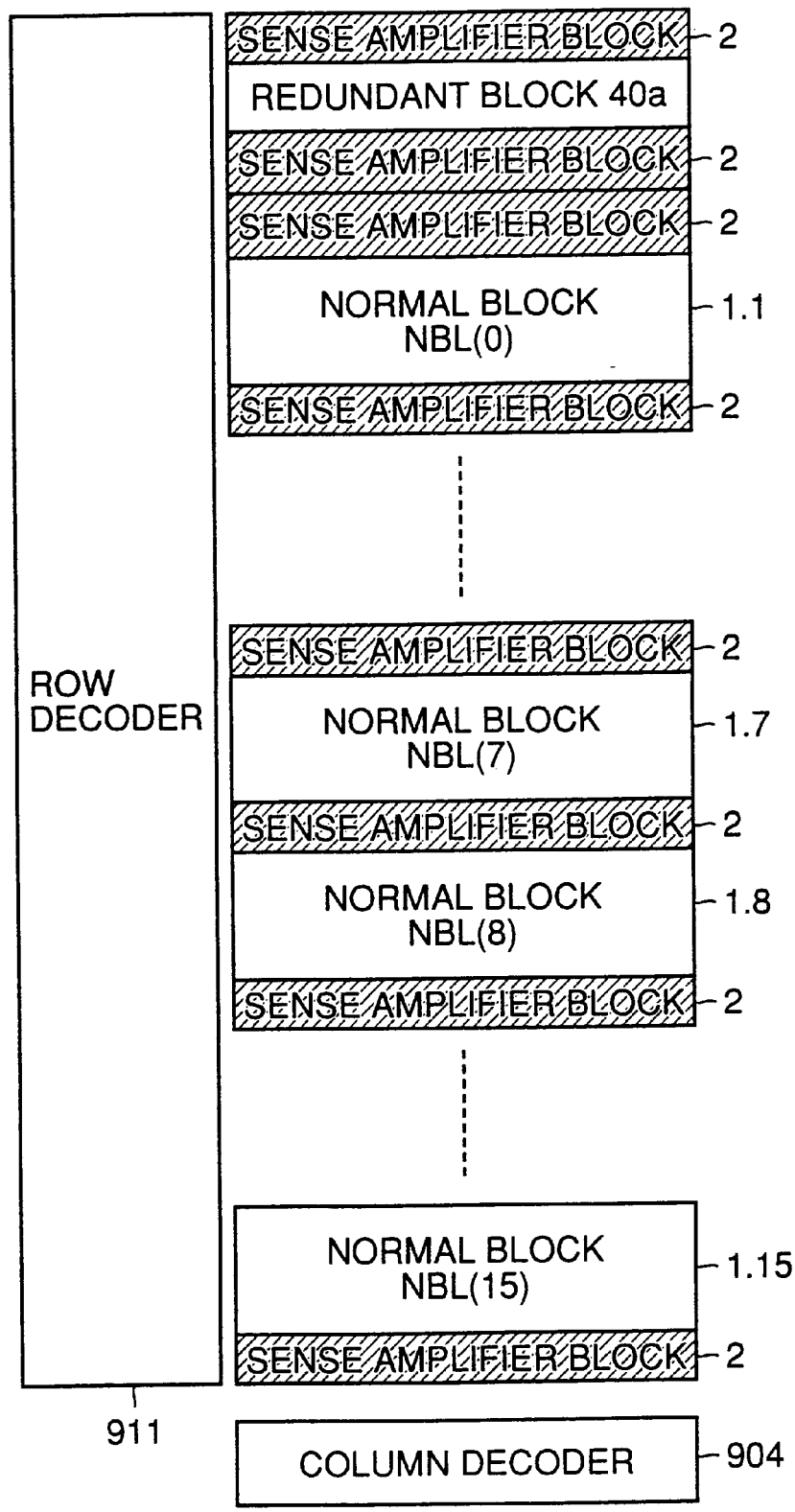
FIG. 18 shows a still further example of substitution in accordance with the fourth embodiment of the present invention.

The effect of the present invention can be obtained not only by the substitution shown in FIG. 16 but also by the substitution in accordance with FIGS. 17 and 18.

Examples of other substitutions in accordance with the fourth embodiment of the present invention will be described with reference to FIGS. 17 and 18. In the configuration shown in FIG. 17, redundant block 40a is used as a substitute for odd-numbered normal blocks NBL (1), NBL (3), . . . , while redundant block 40b is used as a substitute for even-numbered normal blocks NBL (0), NBL (2), . . . .

In the configuration shown in FIG. 18, a dedicated sense amplifier block is provided for one redundant block 40a. Redundant block 40a is used as a substitute for every normal block NBL (0), NBL (1), . . . . In this case also, by controlling a signal to the sense amplifier as the address signal is input, higher speed of access is possible.

The present invention is applicable even when the device does not have the hierarchical word line configuration, and allows higher speed of accessing.

Fifth Embodiment

A semiconductor memory device in accordance with a fifth embodiment of the present invention will be described. In the fifth embodiment of the present invention, in a semiconductor memory device in which redundant cells are physically dispersed within a repairable area, subdecode signals (both normal and redundant subdecode signals) are activated collectively, and only a necessary signal out of the activated subdecode signals is selected after redundancy determination, so as to increase speed of accessing.

The semiconductor memory device in accordance with the fifth embodiment of the present invention will be described with reference to FIG. 19. Same components as those in the semiconductor memory devices 1000 to 1400 are denoted by the same reference characters and description thereof is not repeated.

Figure 19:
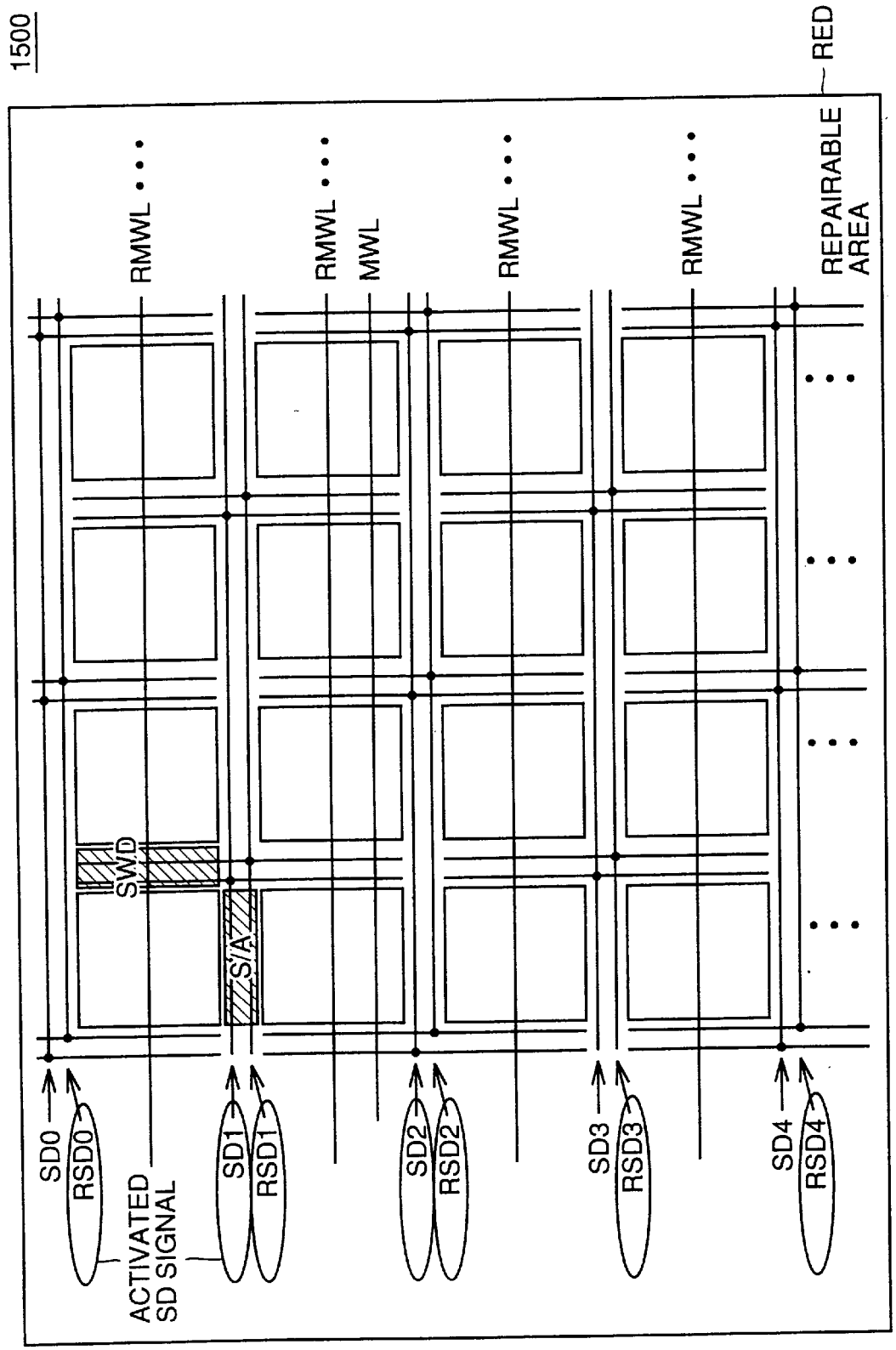
FIG. 19 shows an example of a structure of a main portion of a semiconductor memory device 1500 in accordance with a fifth embodiment of the present invention.

In the semiconductor memory device shown in FIG. 19, redundant main word lines RMWL exist dispersed in a repairable area RED. In every block sectioned by columns of sense amplifiers including a plurality of sense amplifiers S/A, one redundant main word line RMWL is arranged. Subdecode lines SD0, SD1, . . . for transmitting subdecode signals for the normal block and redundant subdecode lines RSD0, RSD1 , . . . transmitting subdecode signals for the redundant block are arranged parallel to each other.

All redundant subdecode lines RSD1, . . . , RSD4 which are possibly used as substitution for the subdecode lines (for example, SD1 and SD2) of the normal block are activated simultaneously.

Configuration of a main portion of the semiconductor memory device 1500 shown in FIG. 19 will be described with reference to FIG. 20. Components similar to those of FIG. 3 are denoted by the same reference characters and description thereof is not repeated.

Figure 20:
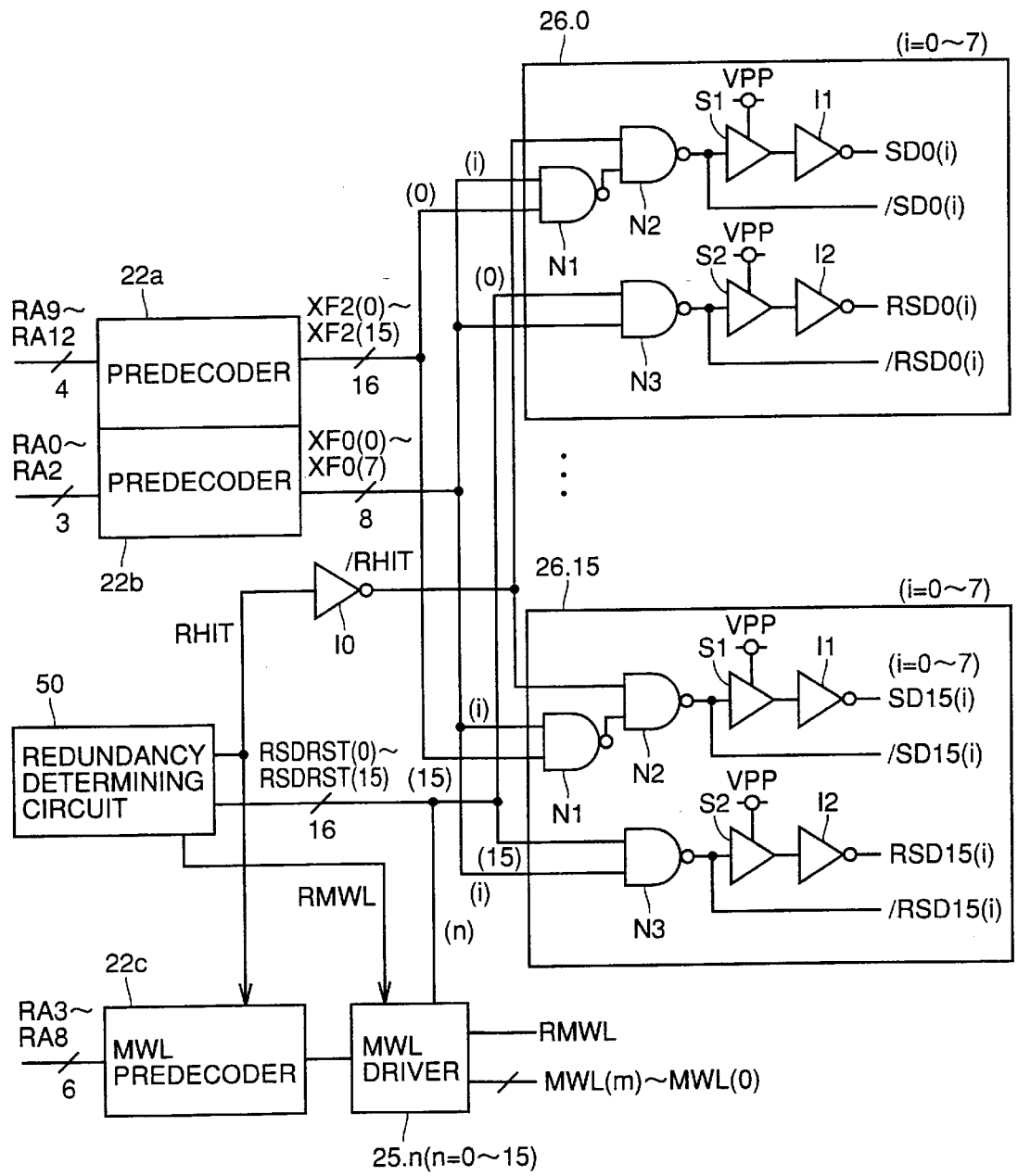
FIG. 20 shows a structure of a main portion of semiconductor memory device 1500 shown in FIG. 19.
Figure 21:
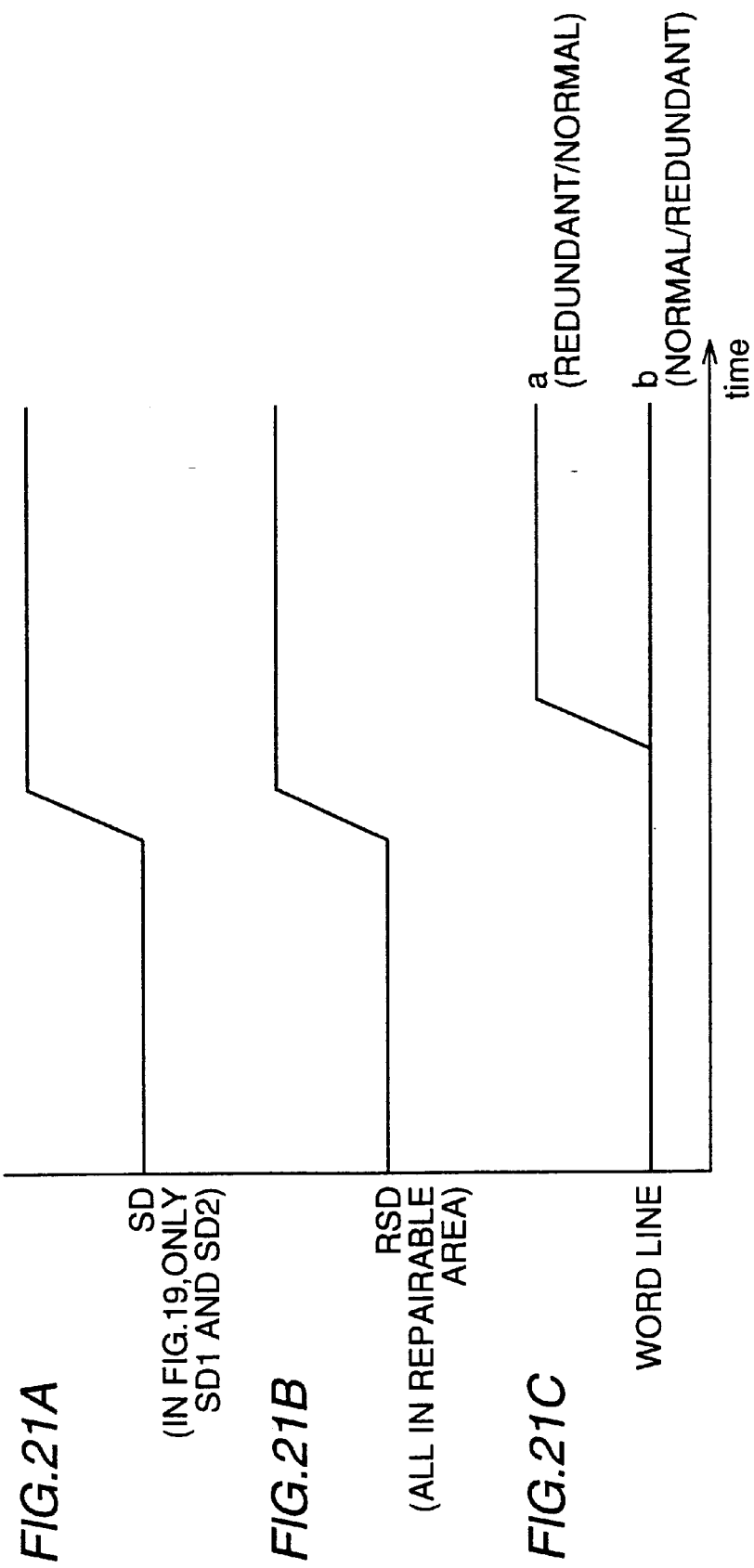
FIGS. 21A to 21C are timing charts related to the operation of semiconductor memory device 1500 in accordance with the fifth embodiment of the present invention shown in FIG. 19.
Figure 22:
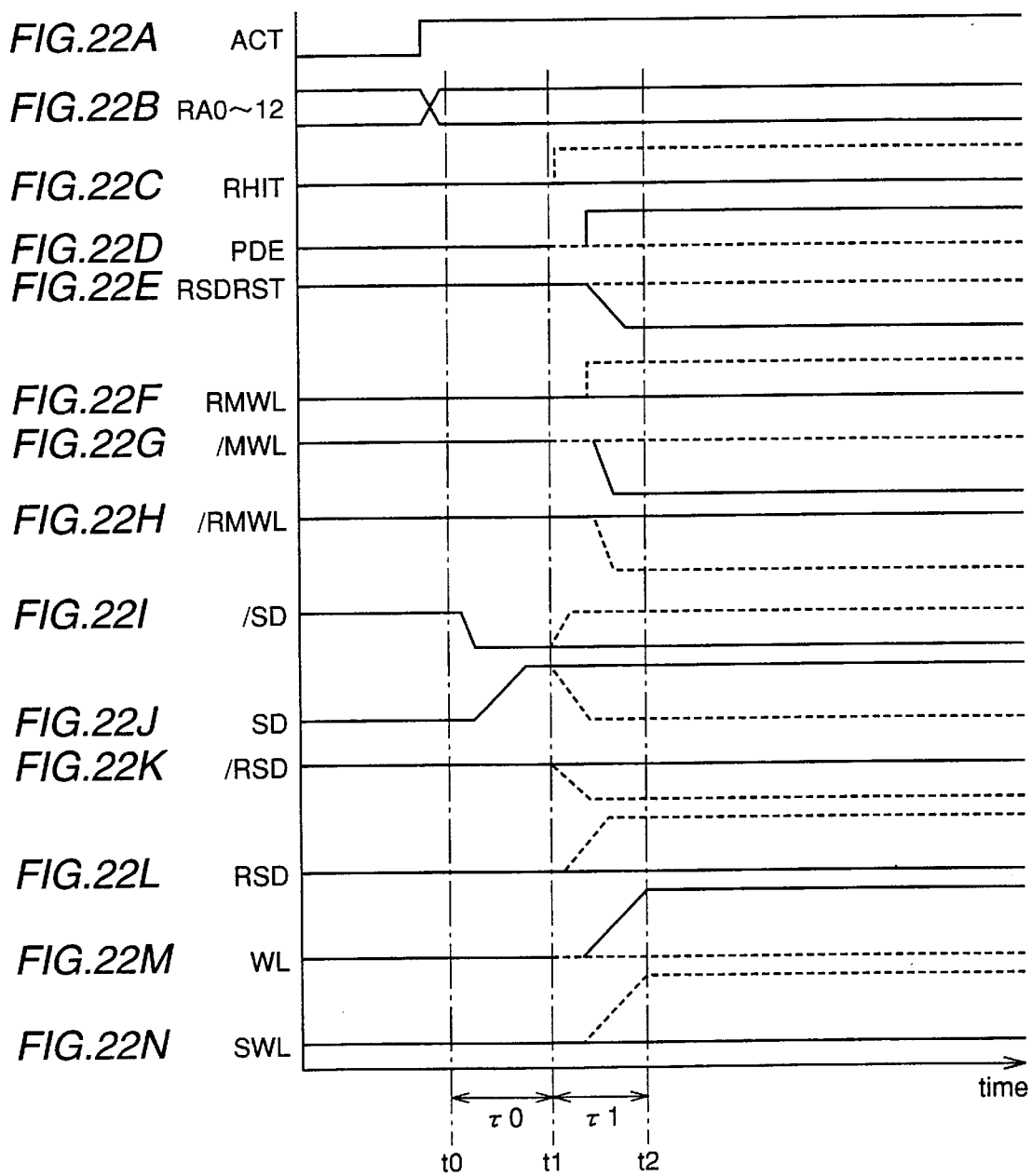
FIGS. 22A to 22N are timing charts related to the operation of semiconductor memory device 1500 in accordance with the fifth embodiment of the present invention shown in FIG. 19.

In the configuration shown in FIG. 20, a redundancy determining circuit 50 is provided in place of redundancy determining circuit 20 shown in FIG. 3. Redundancy determining circuit 50 outputs, in response to an address signal, 16 bits of signals RSDRST (0), ..., RSDRST (15) designating a corresponding block. MWL decoder 25.n receives predecode signals RSDRST (0), ..., RSDRST (15) in place of predecode signals RSDDF (0), ..., RSDF (15).

Before redundancy determination, 16 bits of signal RSDRST (0), ..., RSDRST (15) are all at the H level. When any of the predecode signals XF is activated, the corresponding redundant subdecode line RSD0~RSD15 is activated.

After redundancy determination, all but one of the signals RSDRST (0), ..., RSDRST (15) are set to the L level (non-selection).

The operation of the semiconductor memory device in accordance with the fifth embodiment of the present invention will be described with reference to the time chart of FIGS. 21A to 21C and 22A to 22N.

At the time of row access, in response to address signals RA0~RA12, all redundant subdecode signals which may possibly be used as substitution are activated.

More specifically, subdecode lines (in FIG. 19, SD1 and SD2) in the normal block and all redundant subdecode lines (in FIG. 19, RSD1, ..., RSD4, ...) in the repairable area RED are activated.

After redundancy determination, only one of the corresponding redundant subdecode signal or subdecode signal is left as it is and others are inactivated. As a result, any one word line in the normal block or the redundant block is activated (represented by the reference character a in FIG. 21C), and other word line is inactivated (represented by the reference character b in FIG. 21C).

Redundancy determination is not carried out in the process of activating the subdecode signals. Therefore, the speed of accessing is the same as when the repairable area RED is limited to a block section by sense amplifier blocks.

Sixth Embodiment

A semiconductor memory device in accordance with a sixth embodiment of the present invention will be described. In the semiconductor memory device in accordance with the sixth embodiment of the present invention, access time is reduced by raising subdecode signals (both for the normal and redundant blocks) to an intermediate potential before redundancy determination.

Configuration of the main portion of the semiconductor memory device in accordance with the sixth embodiment of the present invention will be described with reference to FIG. 23.

Figure 23:
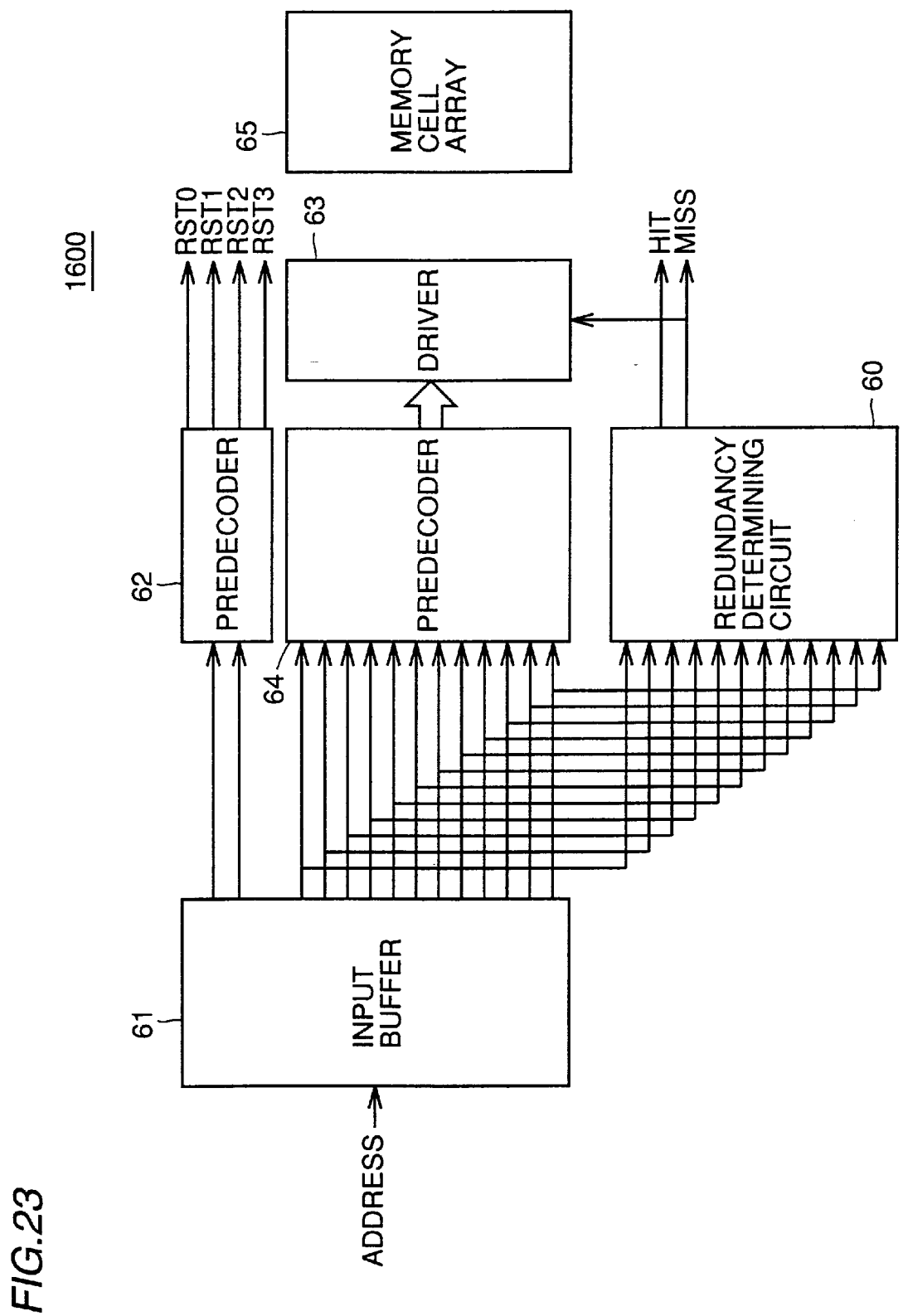
FIG. 23 shows an example of a structure of a main portion of a semiconductor memory device 1600 in accordance with a sixth embodiment of the present invention.

Semiconductor memory device 1600 shown in FIG. 23 includes a memory cell array 65 divided into a plurality of memory blocks, an input buffer 61, predecoders 62 and 64, a driver 63 and a redundancy determining circuit 60.

Input buffer 61 takes an external address signal from the outside. Redundancy determining circuit 60 performs redundancy determination based on the address signal received from input buffer 61. The circuit provides, as a result of determination, determination signals HIT and MISS.

Predecoder 62 outputs reset signals RSD0, ..., based on the address signal received from input buffer 61. Predecoder 64 decodes the address signal received from input buffer 61. Driver 63 sets a word line or a spare word line in memory cell array 65 based on a decode signal output from predecoder 64.

Figure 24:
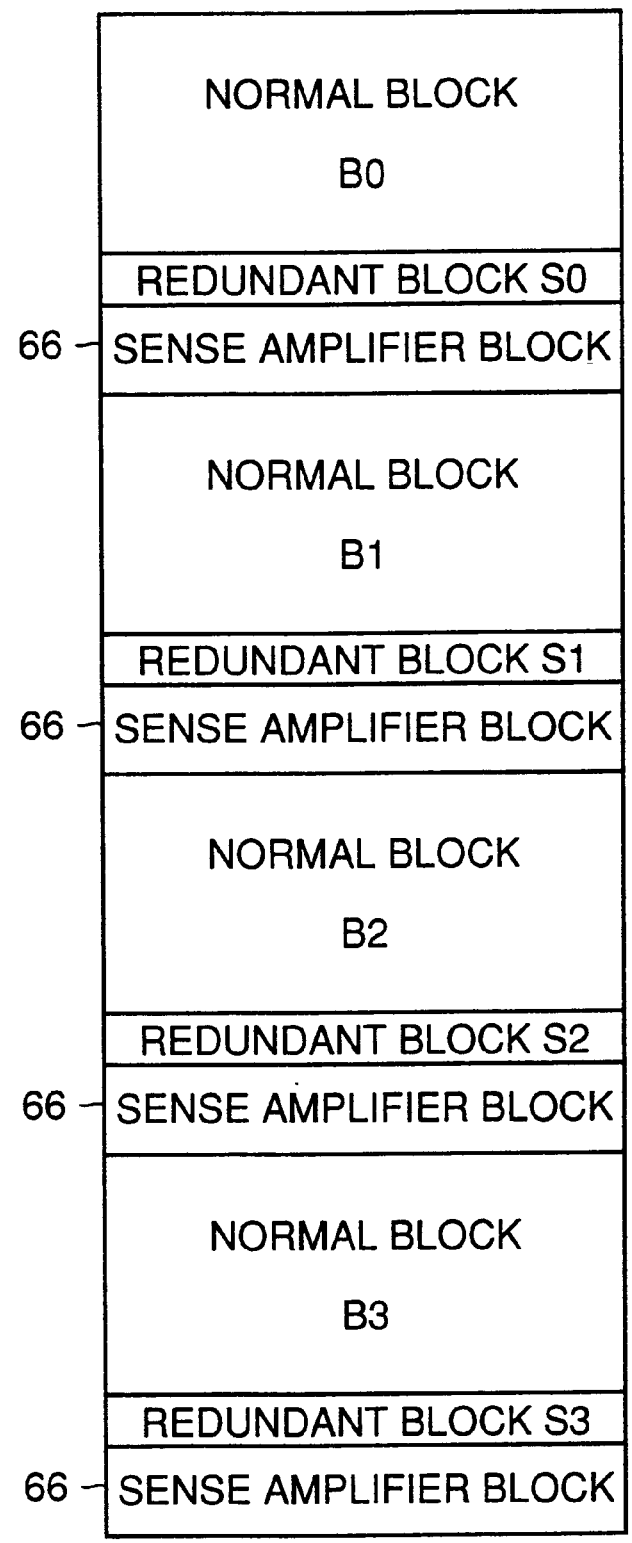
FIG. 24 shows a structure of a memory cell array 65 in accordance with the sixth embodiment shown in FIG. 23.

The configuration of memory cell array 65 in accordance with the sixth embodiment of the present invention shown in FIG. 23 will be described with reference to FIG. 24. Referring to FIG. 24, memory cell array 65 includes sense amplifier blocks 66 and, redundant blocks S0, ..., S3 arranged corresponding to normal blocks B0, ... B3, respectively. Semiconductor memory device 1600 has a hierarchical word line configuration.

A circuit structure of the normal block in accordance with the sixth embodiment of the present invention shown in FIG. 23 will be described with reference to FIG. 25. Circuit structure of the redundant block in accordance with the sixth embodiment of the present invention shown in FIG. 23 will be described with reference to FIG. 26. In the sixth embodiment of the present invention, a signal transmission line transmitting a subdecode signal is divided by the normal block and the redundant block.

Figure 25:
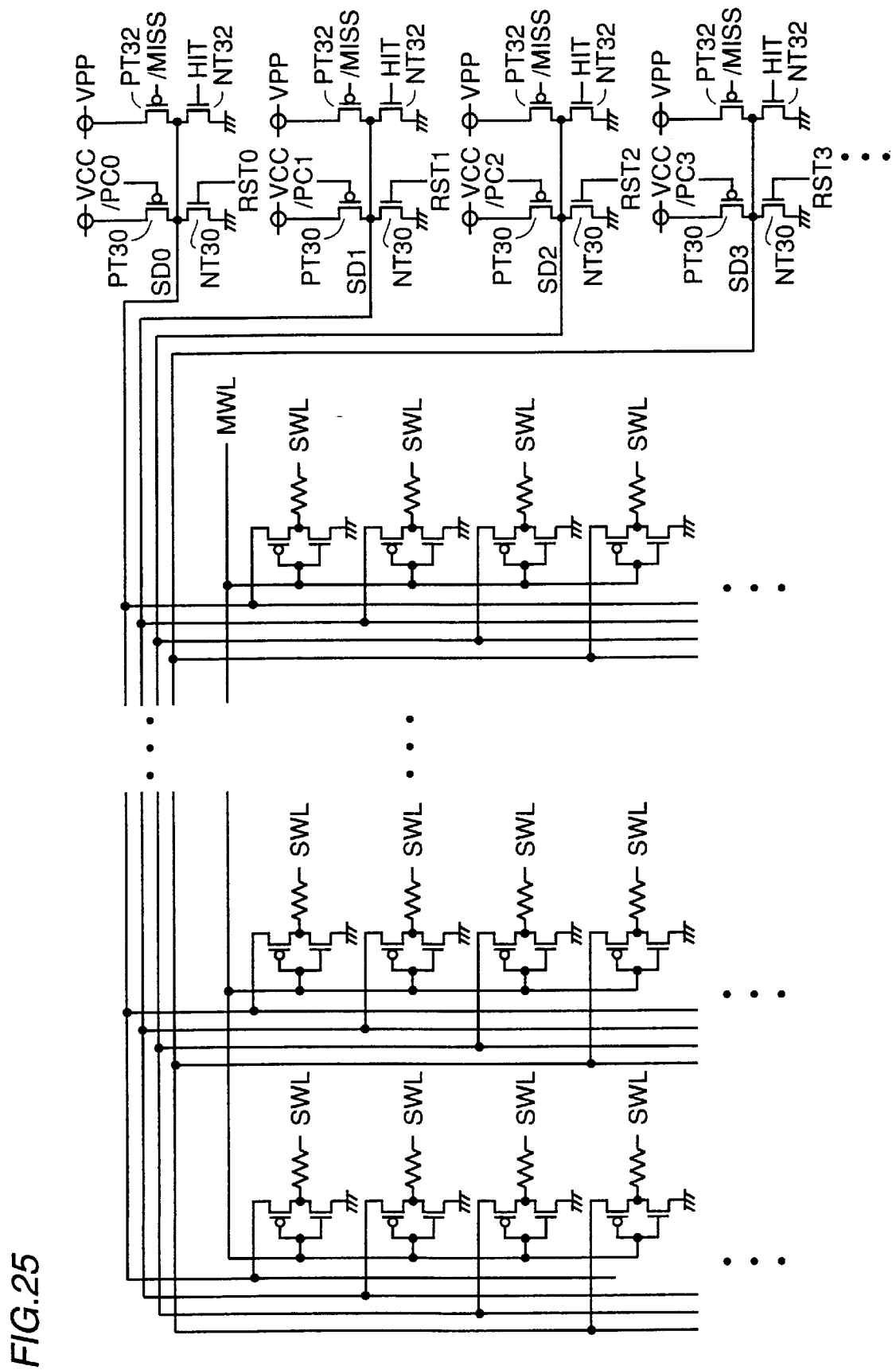
FIG. 25 shows a circuit structure for the normal block in accordance with the sixth embodiment of the present invention shown in FIG. 23.

Referring to FIG. 25, in a normal block, four word lines SWL are arranged for one main word line MWL. As signal lines transmitting subdecode signals allowing selection of any one of the four word lines SWL, subdecode lines SD0, SD1, SD2 and SD3 are arranged.

For each subdecode line, PMOS transistors PT30 and PT32 as well as NMOS transistors NT30 and NT32 are arranged. PMOS transistor PT30 and NMOS transistor NT30 are connected in series between an intermediate potential VCC and the ground potential. PMOS transistor PT32 and NMOS transistor NT32 are connected in series between a power supply potential VPP and the ground potential.

A connection node between PMOS transistor PT30 and NMOS transistor NT30 and connection node between PMOS transistor PT32 and NMOS transistor NT32 are connected to corresponding subdecode lines.

PMOS transistor PT32 receives at its gate electrode, a signal /MISS obtained by inverting determination signal MISS. NMOS transistor NT32 receives at its gate electrode, the determination signal HIT.

To the gate electrodes of NMOS transistors NT30 corresponding to the subdecode lines SD0, SD1, SD2 and SD3, reset signals RST, RST1, RST2 and RST3 are applied, respectively.

To the gate electrodes of PMOS transistors PT30 corresponding to subdecode lines SD0, SD1, SD2 and SD3, precharge signals /PC0, /PC1, /PC2 and /PC3 are applied respectively.

Figure 26:
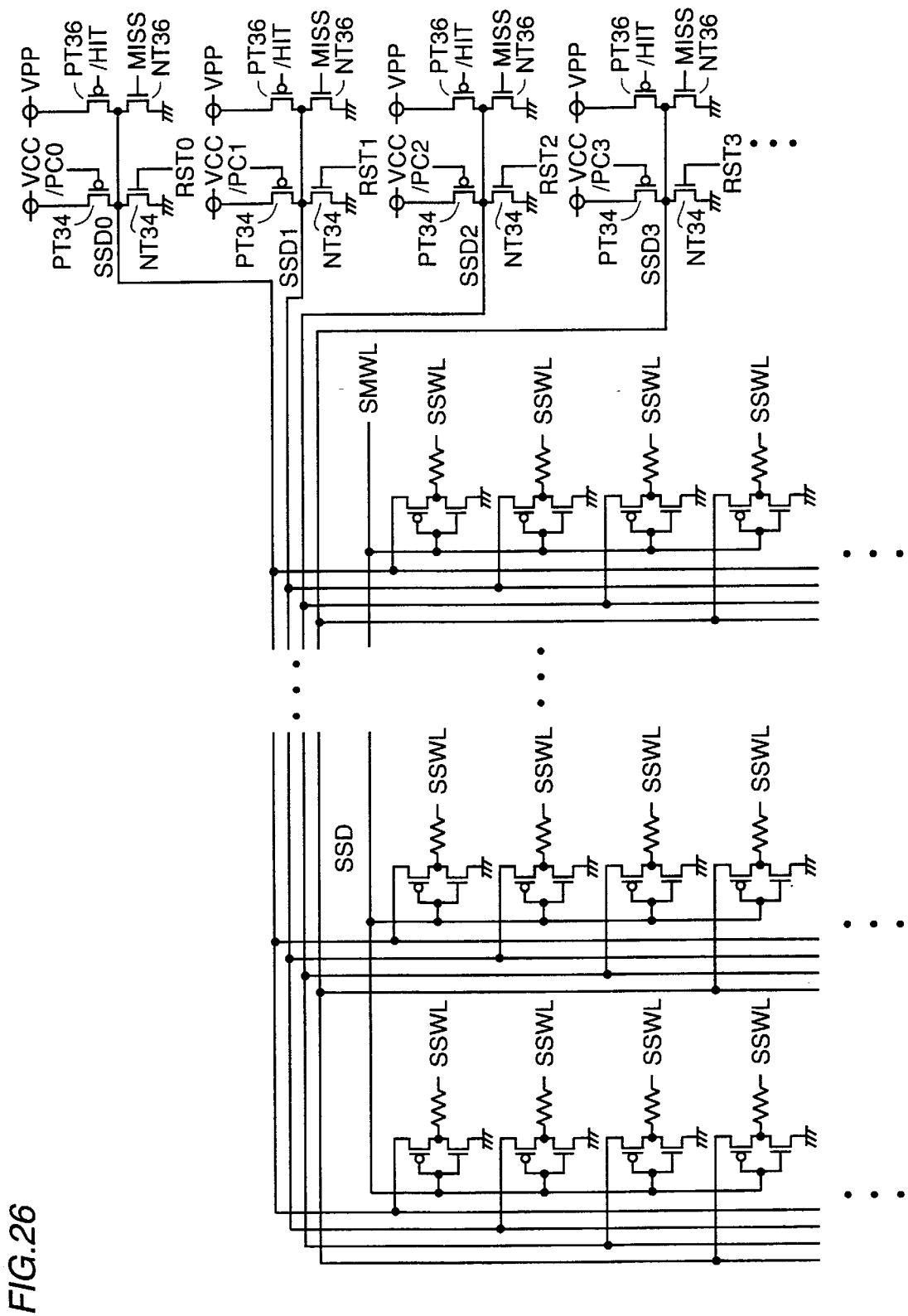
FIG. 26 shows a circuit structure for the redundant block in accordance with the sixth embodiment of the present invention shown in FIG. 23.

Referring to FIG. 26, in the redundant block, four spare word lines SSWL are arranged for one redundant main word line SMWL. As signal lines for transmitting redundant subdecode signals allowing selection of one of four spare word lines SSWL, redundant subdecode lines SSD0, SSD1, SSD2 and SSD3 are arranged.

For each redundant subdecode line, PMOS transistors PT34 and PT36 as well as NMOS transistors NT34 and NT36 are arranged. PMOS transistor PT34 and NMOS transistor NT34 are connected in series between the intermediate potential VCC and the ground potential. PMOS transistor PT36 and NMOS transistor NT36 are connected in series between the power supply potential VPP and the ground potential.

A connection node between PMOS transistor PT34 and NMOS transistor NT34 and a connection node between PMOS transistor PT36 and NMOS transistor NT36 are connected to a corresponding redundant subdecode line.

PMOS transistor PT36 receives at its gate electrode a signal /HIT obtained by inverting the determination signal HIT. NMOS transistor NT36 receives at its gate electrode the determination signal MISS.

To the gate electrodes of NMOS transistors NT34 for the redundant subdecode lines SSD0, SSD1, SSD2 and SSD3, reset signals RST0, RST1, RST2 and RST4 are applied, respectively.

To the gate electrodes of PMOS transistors PT34 of redundant subdecode lines SSD0, SSD1, SSD2 and SSD3, precharge signals /PC0, /PC1, /PC2 and /PC3 are applied, respectively.

When a bank activation signal is input based on a signal obtained by decoding higher bits of an input address signals, subdecode lines and redundant subdecode lines related to the corresponding word line SWL and spare word line SSWL are activated simultaneously. At this time point, the level of activation is set to be the intermediate potential VCC.

When the result of redundancy determination is given, whether the subdecode lines in the normal block or the redundant subdecode lines in the redundant block are to be activated is selected. The voltage level of the selected subdecode line (redundant subdecode line) is raised to the level of the power supply potential VPP. Non-selected subdecode lines (redundant subdecode lines) are inactivated.

Figure 27:
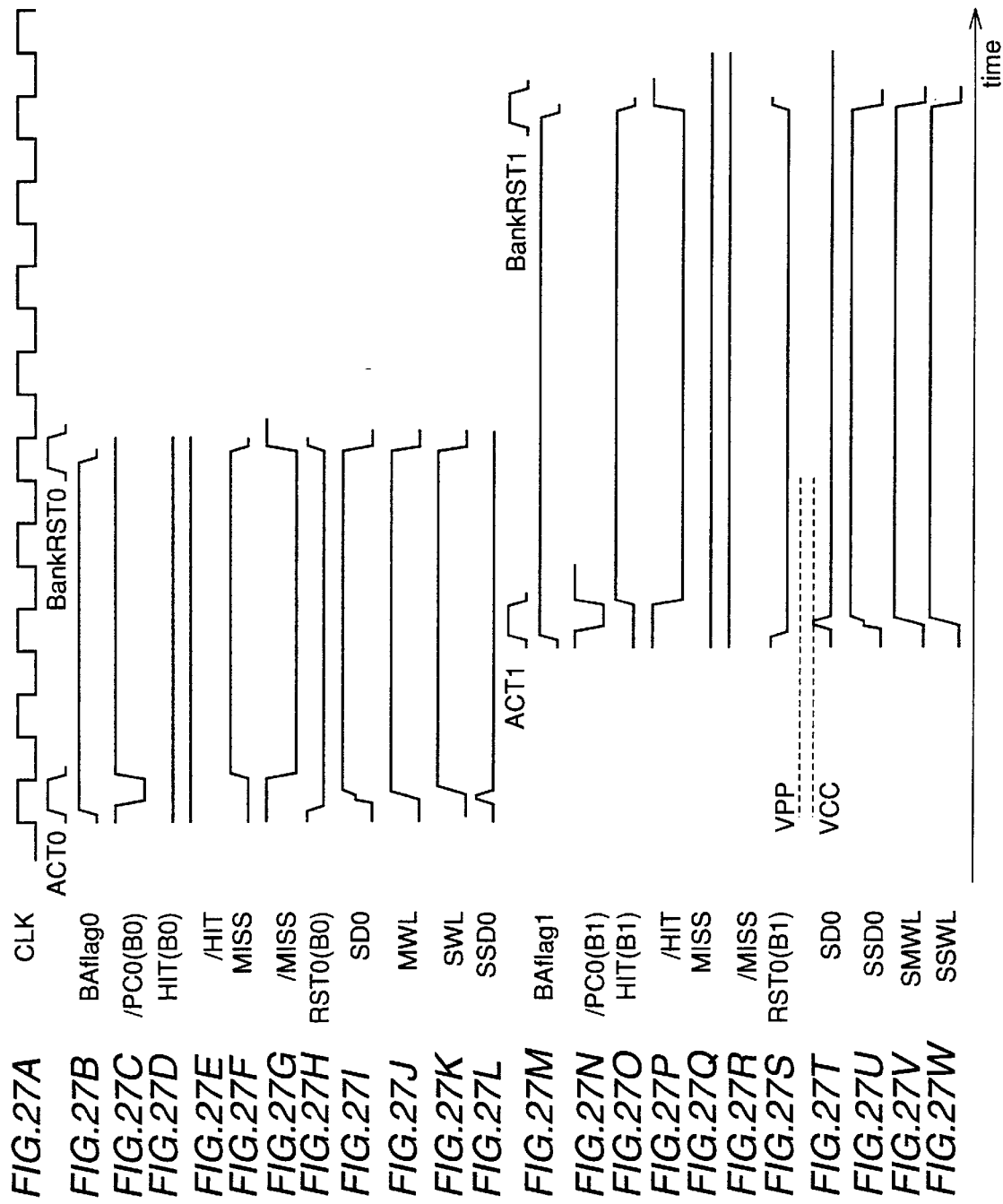
FIGS. 27A to 27W are timing charts related to the operation of semiconductor memory device 1600 in accordance with the sixth embodiment of the present invention.

Operation of the semiconductor memory device 1600 in accordance with the sixth embodiment of the present invention will be described with reference to the timing chart of FIGS. 27A to 27W.

Semiconductor memory device 1600 operates in synchronization with an internal clock signal CLK. It is assumed that a subdecode signal SD0 is selected in accordance with an address signal.

When an activation signal ACT0 for a certain bank BK0 is input, a flag BA flag0 is activated. A precharge signal /PC (B0) for the bank BK0 is temporarily activated. A reset signal RST0 (B0) for the bank BK0 is inactivated. Based on the flag BAflag0, subdecode line SD0 and redundant subdecode line SSD0 are precharged in accordance with the address signal.

Now, when the selected memory cell in the normal block is free of any defect, determination signal MISS is activated. Consequently, potential of subdecode line SD0 rises to the level of the power supply potential VPP. The potential of the redundant subdecode line SSD0 is lowered to the ground potential level.

Thereafter, as the corresponding main word line MWL is activated, the selected word line SWL is set to the selected state. This state is kept until an input of a signal Bank RST0 for resetting activation of the bank.

When an activation signal ACT1 for the bank BK1 is input, a flag BAflag1 is activated. A precharge signal /PC (B1) for the bank BK1 is temporarily activated. A reset signal RST0 (B1) corresponding to the bank BK1 is inactivated. Based on the flag BAflag1, subdecode line SD0 and redundant subdecode line SSD0 are precharged, in accordance with the address signal.

Here, if the selected memory cell of the normal block is defective, determination signal HIT (B1) is activated. Consequently, potential of redundant subdecode line SSD0 is raised to the level of the power supply potential VPP. The potential of subdecode line SD0 is lowered to the level of the ground potential.

Thereafter, as the corresponding redundant main word line SMWL is activated, the selected spare word line SSWL is selected. This state is kept until an input of the signal Bank RST1 for resetting activation of the bank.

In this manner, by using a result of decoding higher bits of the address signals, it becomes possible to activate both the subdecode line and the redundant subdecode line to the intermediate level at high speed, regardless of redundancy determination.

As the subdecode lines and redundant subdecode lines are activated in advance, it becomes possible to select a word line at high speed utilizing the result of redundancy determination.

Further, as the level of activation is set at the intermediate potential VCC and not a high potential such as the power supply potential VPP, power consumption can be suppressed. Further, load on the circuit generating the power supply potential can be reduced.

Seventh Embodiment

A semiconductor memory device in accordance with a seventh embodiment of the present invention will be described. In the semiconductor memory device in accordance with the seventh embodiment, repair efficiency is improved as a dedicated redundant block is arranged for every bank including a plurality of normal blocks.

Figure 28:
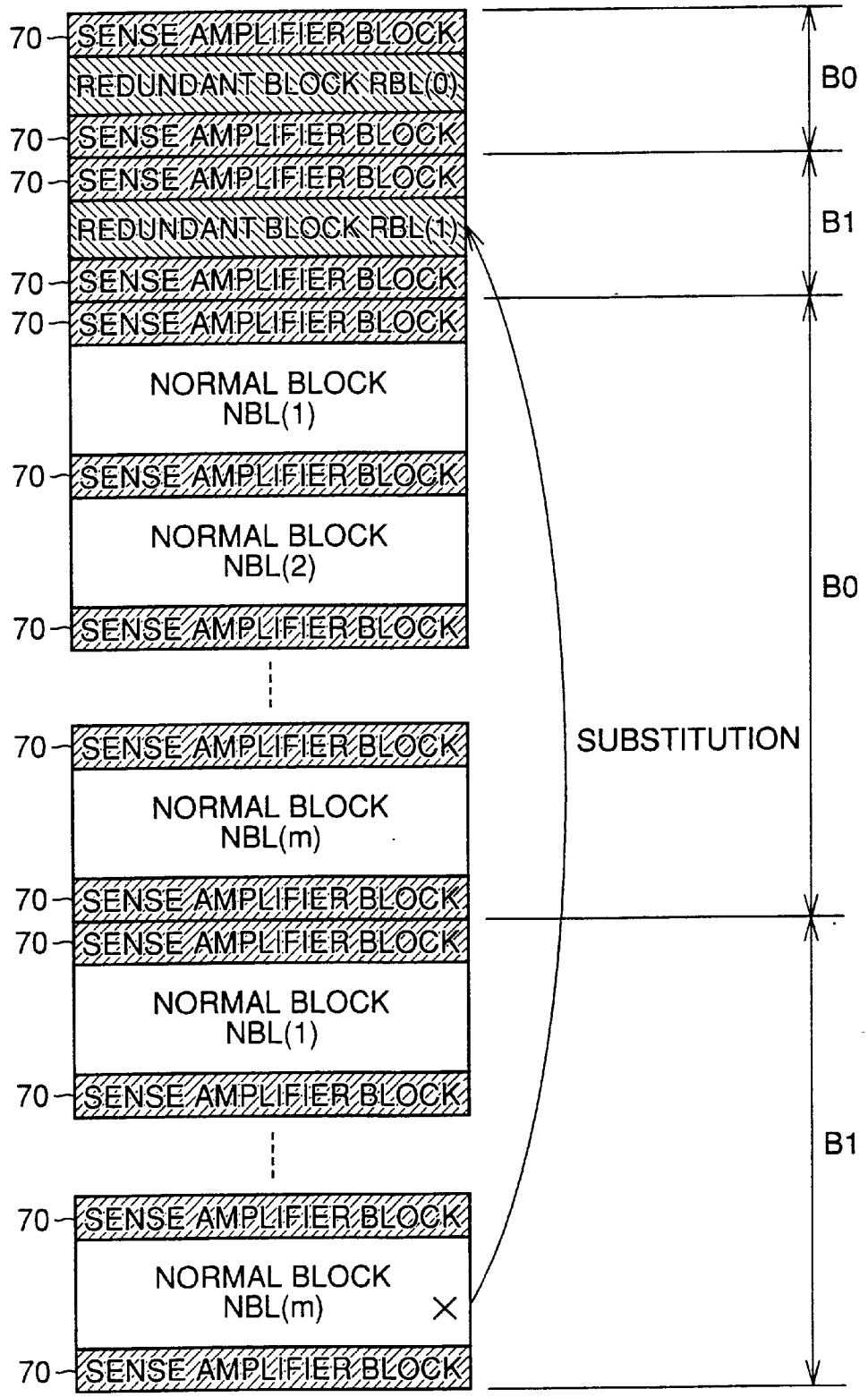
FIG. 28 shows a structure of a memory mat of a semiconductor memory device 1700 in accordance with a seventh embodiment of the present invention.

Configuration of a memory mat in the semiconductor memory device 1700 in accordance with the seventh embodiment of the present invention will be described with reference to FIG. 28. The memory mat shown in FIG. 28 has two banks B0 and B1 arranged therein.

Banks B0 and B1 each include normal blocks NBL (0), . . . , NBL (m) constituted by normal memory cells, and have shared sense amplifier structure (sense amplifier blocks 70).

Further, banks B0 and B1 each include redundant blocks RBL (0) and RBl (1) constituted by redundant cells. Redundant blocks RBL (0) and RBL (1) both have the shared sense amplifier structure (sense amplifier blocks 70).

A normal block in bank B0 is substituted by redundant block RBL (0) in the same bank. A normal block in bank B1 is substituted by redundant block RBl (1) of the same bank.

Banks B0 and B1 operate in response to an internal clock signal, and independent from each other.

As the redundant blocks are arranged independently for each bank, high speed repairment is possible.

Eighth Embodiment

A semiconductor memory device in accordance with an eighth embodiment of the present invention will be described. As compared with the semiconductor memory device in accordance with the seventh embodiment, in the semiconductor memory device in accordance with the eighth embodiment, repair efficiency is improved and layout area is reduced, as the sense amplifiers are shared.

The memory mat configuration of the semiconductor memory device 1800 in accordance with the eighth embodiment of the present invention will be described with reference to FIG. 29. Portions corresponding to those of FIG. 28 are denoted by the same reference characters and description thereof will not be repeated.

Figure 29:
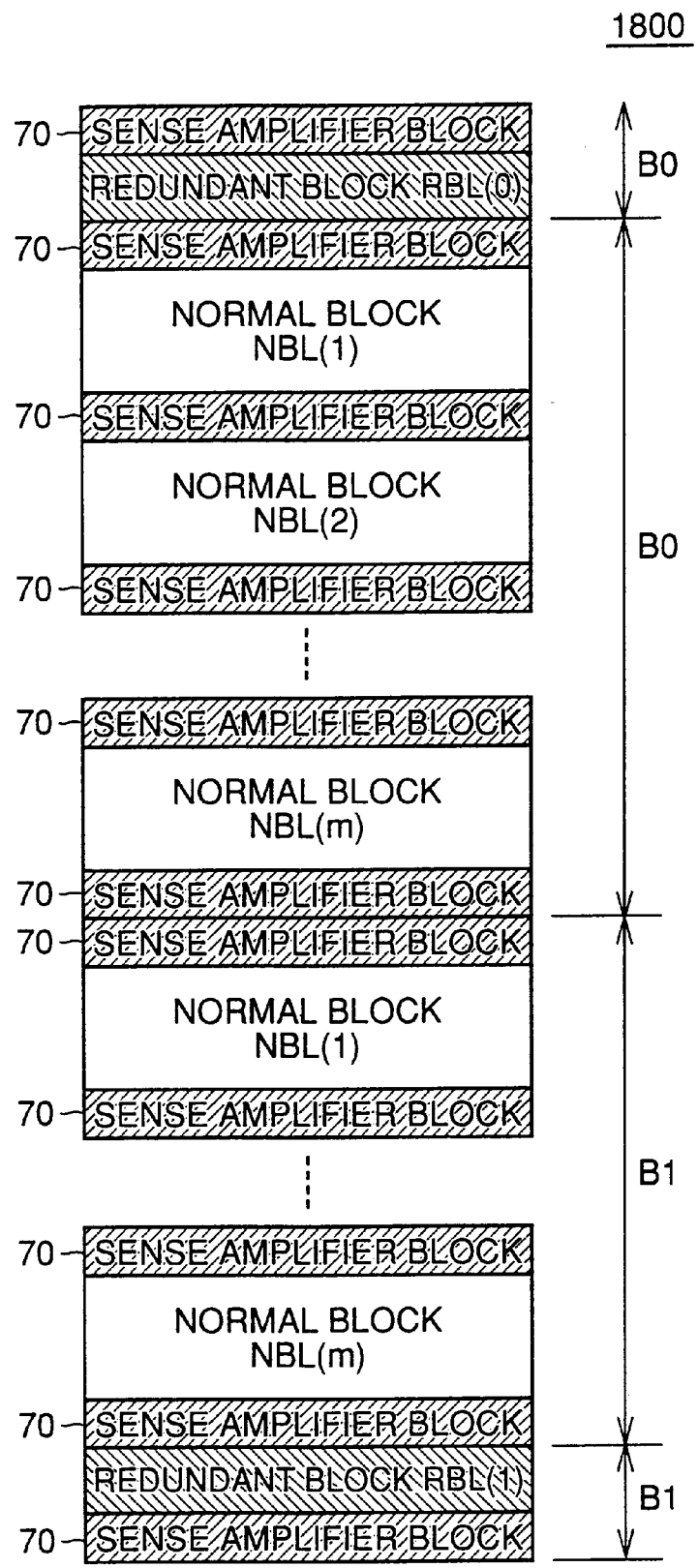
FIG. 29 shows a structure of a memory mat of a semiconductor memory device 1800 in accordance with an eighth embodiment of the present invention.

The memory mat shown in FIG. 29 includes two banks B0 and B1. Normal blocks NBL (0), . . . , NBL (m) and redundant block RBL (0) in bank B0 have shared sense amplifier structure (sense amplifier blocks 70). Normal blocks NBL (0), . . . , NBL (m) and redundant block RBL (1) in bank B1 have the shared sense amplifier structure (sense amplifier block 70).

Redundant block RBL (0) corresponding to bank B0 and normal block NBL (0) belonging to the same bank B0 share sense amplifier block 70. Redundant block RBL (1) and normal block NBL (m) belonging to the same bank B1 share sense amplifier block 70.

Such configuration allows repairment at high speed, and reduces layout area.

Ninth Embodiment

The semiconductor memory device in accordance with a ninth embodiment of the present invention will be described. As compared with the semiconductor memory device in accordance with the eighth embodiment, the semiconductor memory device in accordance with the ninth embodiment of the present invention has such a structure as shown in FIG. 30.

The memory mat configuration of semiconductor memory device 1900 in accordance with the ninth embodiment of the present invention will be described with reference to FIG. 30. Portions corresponding to those of FIG. 29 are denoted by the same reference characters and description thereof will not be repeated.

Figure 30:
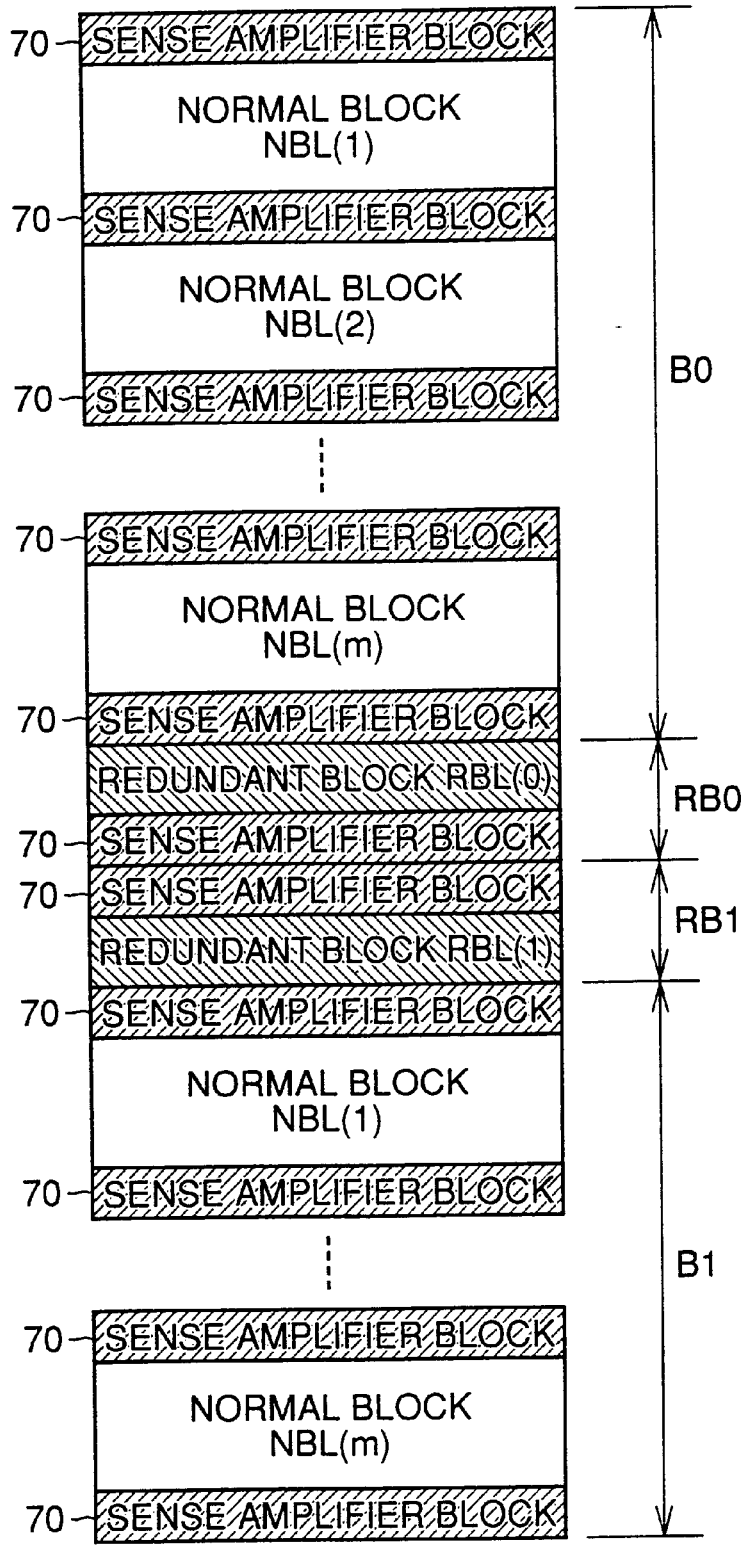
FIG. 30 shows a structure of a memory mat of a semiconductor memory device 1900 in accordance with a ninth embodiment of the present invention.

The memory mat shown in FIG. 30 includes two banks B0 and B1. Normal blocks NBL (0), . . . , NBL (m) and redundant block RBL (0) in bank B0 have shared sense amplifier structure (sense amplifier block 70). Normal blocks NBL (0), . . . , NBL (m) and redundant block RBL (1) in bank B1 have shared sense amplifier structure (sense amplifier blocks 70).

Redundant blocks RBL (0) and RBL (1) are arranged on an area between banks B0 and B1.

Redundant block RBL (0) corresponding to bank B0 and normal block NBL (m) belonging to the same bank B0 share sense amplifier block 70.

Redundant block RBL (1) corresponding to bank B1 and normal block NBL (1) belonging to the same bank B1 share sense amplifier block 70.

Such configuration allows high speed repairment, and reduction in layout area.

Tenth Embodiment

The semiconductor memory device in accordance with the tenth embodiment of the present invention will be described.

The memory mat configuration of the semiconductor memory device 200 in accordance with the tenth embodiment of the present invention will be described with reference to FIG. 31. Portions corresponding to those of FIG. 30 are denoted by the same reference characters and description thereof is not repeated.

Figure 31:
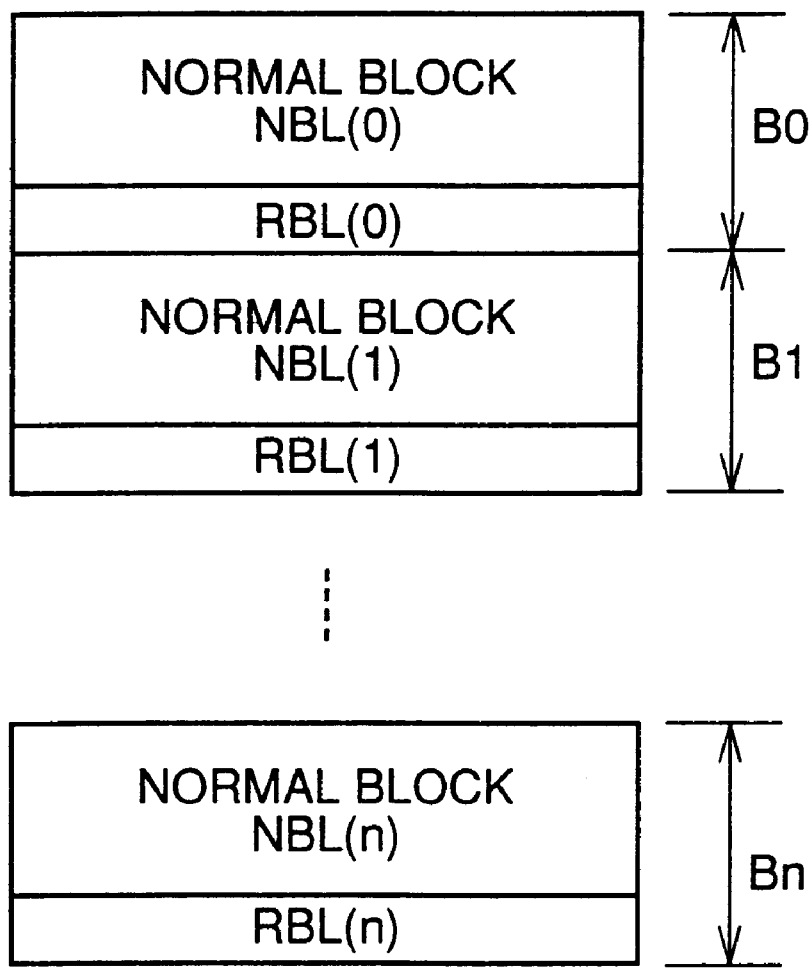
FIG. 31 shows a structure of a memory mat of a semiconductor memory device 2000 in accordance with a tenth embodiment of the present invention.
Figure 32:
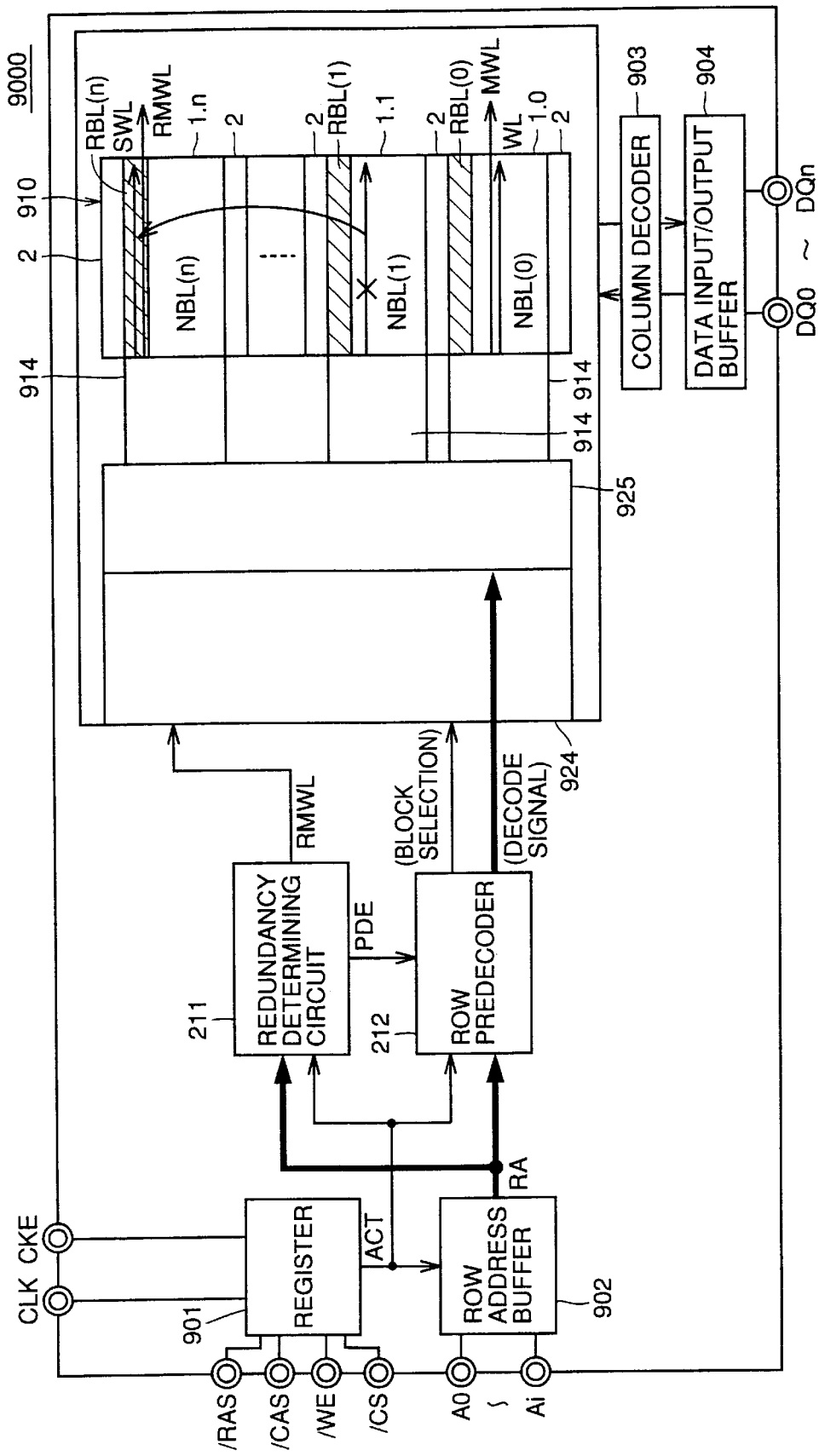
FIG. 32 shows an overall structure of a conventional semiconductor memory device 900.

The memory mat shown in FIG. 31 includes two or more banks B0, . . . , Bn. Each bank includes normal blocks (in the figure, NBL (0), NBL (1), . . . ,) and redundant blocks (in the figure, RBL (0), RBL (1), . . . ,).

The redundant block in each bank is used as a substitute for a normal block belong to the same block. Each bank operates independent from each other in response to an internal clock signal. This configuration allows high speed repairment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory blocks, each including
      a normal block including a plurality of normal memory cells arranged in rows and columns, a plurality of word lines arranged corresponding to said rows and a plurality of bit lines arranged corresponding to said columns, and
      a redundant block including a plurality of redundant cells arranged in rows and columns, a plurality of redundant word lines arranged corresponding to said rows and a plurality of bit lines arranged corresponding to said columns,
      the redundant cells being used as substitution for a normal memory cell belonging to any of said plurality of memory blocks;
   determining means for determining whether redundancy is to be used or not, in response to an external address signal;
   first control means responsive to said external address signal for setting a corresponding word line to a selected state, independent from result of determination by said determining means; and
   second control means, receiving result of determination of said determining means, for setting a corresponding redundant word line to a selected state based on said external address signal; wherein
   said first control means sets said corresponding word line to a non-selected state, in response to result of determination that redundancy is to be used by said determining means.

2. The semiconductor memory device according to claim 1, wherein
   said first control means includes
      first signal generating means for generating a word line activating signal for activating said corresponding word line in response to said external address signal, and
      a plurality of normal cell selecting means provided corresponding to said plurality of word lines in said plurality of normal blocks respectively, each responsive to said word line activating signal for setting said corresponding word line to the selected state;
   said second control means includes second signal generating means responsive to result of determination that redundancy is to be used by said determining means, for generating a redundant word line activating signal for activating said corresponding redundant word line in response to said external address signal, and
   a plurality of redundant cell selecting means provided corresponding to said respective redundant word lines in said plurality of redundant blocks, respectively, each responsive to said redundant word line activating signal for setting said corresponding redundant word line to the selected state; and
   said first signal generating means inactivates said word line activating signal, which has been activated, in response to result of determination that redundancy is to be used received from said determining means.

3. The semiconductor memory device according to claim 2, wherein said plurality of normal blocks are divided into a plurality of first groups, each group including adjacent two normal blocks;
   said first signal generating means includes a plurality of first generating means arranged corresponding to said first groups, said plurality of first generating means each including
      means responsive to said external address signal for simultaneously generating said word line activating signal in respective ones of corresponding said adjacent normal blocks, and
      means responsive to said external address signal for selecting and outputting, of said generated word line activating signals, said word line activating signal corresponding to either one of said normal blocks;
   said plurality of redundant blocks are divided into a plurality of second groups, each group including of adjacent two redundant blocks;
   said second signal generating means includes a plurality of second generating means arranged corresponding to said second groups,
   each of said second generating means including
      means responsive to said external address signal, for simultaneously generating said redundant word line activating signals in respective ones of the corresponding said adjacent redundant blocks, and means responsive to said external address signal for selecting and outputting, of said generated redundant word line activating signals, said redundant word line activating signal corresponding to either one of said redundant blocks.

4. The semiconductor memory device according to claim 2, wherein each of said plurality of word lines includes
a main word line, and
a plurality of sub word lines provided corresponding to said main word line;

each of said plurality of redundant word lines includes
a redundant main word line, and
a plurality of spare word lines provided corresponding to said redundant main word line;
said word line activating signal sets one of said sub word lines to a selected state, and
said redundant word line activating signal sets one of said spare word lines to the selected state.

5. The semiconductor memory device according to claim 3, wherein each of said plurality of word lines includes
a main word line, and
a plurality of sub word lines provided corresponding to said main word line;

each of said plurality of redundant word lines includes
a redundant main word line, and
a plurality of spare word lines provided corresponding to said redundant main word line;
said word line activating signal sets one of said sub word lines to a selected state, and
said redundant word line activating signal sets one of said spare word line to the selected state.

6. A semiconductor memory device, comprising:

a plurality of memory blocks, each including
a normal block including a plurality of normal memory cells arranged in rows and columns, a plurality of word lines arranged corresponding to said rows and a plurality of bit line pairs arranged corresponding to said columns,
at least one of said plurality of memory blocks further including a redundant block including a plurality of redundant cells arranged in rows and columns, a plurality of redundant word lines arranged corresponding to said rows and a plurality of bit line pairs arranged corresponding to said columns,
the redundant cells being used as substitution of a normal memory cell belonging to any of said plurality of memory blocks;

determining means responsive to an external address signal for determining whether redundancy is to be used or not;

first control means responsive to said external address signal for setting a corresponding word line to a selected state, independent from result of determination by said determining means; and second control means responsive to said external address signal for setting a corresponding one of the redundant word line to the selected state, independent from the result of determination by said determining means; wherein said first control means, responsive to result of determination that redundancy is to be used by said determining means, controls such that said corresponding word line is set to a non-selected state, and said second control means, responsive to result of determination that redundancy is not to be used by said determining means, control such that said corresponding redundant word line is set to the non-selected state.

7. The semiconductor memory device according to claim 6, wherein said first control means includes
first signal generating means for generating a word line activating signal for activating said corresponding word line in response to said external address signal, and
a plurality of normal cell selecting means provided corresponding to said plurality of word lines in said plurality of normal block respectively, each responsive to said word line activating signal for setting said corresponding word line to the selected state;

said second control means includes
second signal generating means for generating a redundant word line activating signal for activating said corresponding redundant word line in response to said external address signal, and
a plurality of redundant cell selecting means provided corresponding to said plurality of redundant word lines in said plurality of redundant blocks respectively, each responsive to said redundant word line activating signal for setting said corresponding redundant word line to the selected state;

said first signal generating means inactivates said word line activating signal which has been activated, in response to result of determination that redundancy is to be used, from said determining means; and said second signal generating means inactivates said redundant word line activating signal which has been activated, in response to result of determination that redundancy is not to be used, from said determining means.

8. The semiconductor memory device according to claim 6, further comprising:

a plurality of sense amplifier blocks provided corresponding to said plurality of normal blocks and said plurality of redundant blocks, respectively, each of said plurality of sense amplifier blocks including
a plurality of sense amplifier means, each including
means for amplifying potential of corresponding one of said bit line, pairs,
an equalizing circuit for equalizing potentials of corresponding said bit line pairs and
an S/A share circuit for separating said bit line pairs corresponding to non-selected memory block side;

said first control means generates, responsive to said external address signal, a first control signal for controlling activation of said sense amplifier block of corresponding one of said normal blocks;

said second control means generates, responsive to said external address signal, a second control signal for controlling activation of said sense amplifier block of corresponding one of said redundant blocks;

said first signal generating means changes, in response to result of determination that redundancy is to be used from said determining means, level of said generated first control signal; and said second signal generating means changes, in response to result of determination that redundancy is not to be used from said determining means, level of said generated second control signal.

9. The semiconductor memory device according to claim 8, wherein
said first control means includes
first signal generating means for generating a word line activating signal for activating said corresponding word line in response to said external address signal, and
a plurality of normal cell selecting means provided corresponding to said plurality of word lines in said plurality of normal blocks respectively, each responsive to said word line activating signal for setting said corresponding word line to the selected state;
said second control means includes
second signal generating means for generating a redundant word line activating signal for activating said corresponding redundant word line in response to said external address signal, and
a plurality of redundant cell selecting means provided corresponding to said plurality of redundant word lines in said plurality of redundant blocks respectively, each responsive to said redundant word line activating signal for setting said corresponding redundant word line to the selected state;
said first signal generating means inactivates said word line activating signal which has been activated, in response to result of determination that redundancy is to be used, from said determining means; and
said second signal generating means inactivates said redundant word line activating signal which has been activated, in response to result of determination that redundancy is not to be used, from said determining means.

10. The semiconductor memory device according to claim 6, wherein
said first control means includes
first signal generating means for generating a word line activating signal of a first level for activating said corresponding word line in response to said external address signal,
means responsive to result of determination that redundancy is not to be used from said determining means for setting level of said word line activating signal, which has been at said first level, to an activation level, and
a plurality of normal cell selecting means provided corresponding to said plurality of word lines of said plurality of normal blocks respectively, each responsive to said word line activating signal for setting said corresponding word line to the selected state;
said second control means includes
second signal generating means for generating a redundant word line activating signal at a first level for activating said corresponding redundant word line in response to said external address signal,
means responsive to result of determination that redundancy is to be used from said determining means for setting level of said redundant word line activating signal which has been at said first level to an activation level, and
a plurality of redundant cell selecting means provided corresponding to said plurality of redundant word lines of said plurality of redundant blocks, each responsive to said redundant word line activating signal for setting said corresponding redundant word line to the selected state;
said first signal generating means inactivates said word line activating signal which has been activated, in response to result of determination that redundancy is to be used, from said determining means; and
said second signal generating means inactivates said redundant word line activating signal which has been activated, in response to result of determination that redundancy is not to be used, from said determining means.

11. The semiconductor memory device according to claim 10, wherein said first level is substantially an intermediate value between said activation level and a level for said inactivation.

12. The semiconductor memory device according to claim 7, wherein
each of said plurality of word lines includes
a main word line, and
a plurality of sub word lines provided corresponding to said main word line;
each of said plurality of redundant word lines includes
a redundant main word line, and
a plurality of spare word lines provided corresponding to said redundant main word line;
said word line activating signal set one of said sub word lines to a selected state, and
said redundant word line activating signal sets one of said spare word lines to the selected state.

13. The semiconductor memory device according to claim 9, wherein
each of said plurality of word lines includes
a main word line, and
a plurality of sub word lines provided corresponding to said main word line;
each of said plurality of redundant word lines includes
a redundant main word line, and
a plurality of spare word lines provided corresponding to said redundant main word line;
said word line activating signal sets one of said sub word lines to a selected state, and
said redundant word line activating signal sets one of said spare word line to the selected state.

14. A semiconductor memory device, comprising:
a normal block including a plurality of normal memory cells arranged in rows and columns, a plurality of word lines arranged corresponding to said rows and a plurality of bit lines arranged corresponding to said columns;
a redundant block including a plurality of redundant cells arranged in rows and columns as substitution for corresponding normal memory cells, a plurality of redundant word lines arranged corresponding to said rows and a plurality of bit lines arranged corresponding to said columns;
determining means responsive to an external address signal for determining whether redundancy is to be used or not;
first control means responsive to said external address signal for setting a corresponding word line to a selected state, independent from result of determination by said determining means; and
second control means responsive to said external address signal for setting a corresponding redundant word line to the selected state, independent from result of determination by said determining means; wherein
said first control means, responsive to result of determination that redundancy is to be used by said determining means, controls such that said corresponding word line is set to a non-selected state, and said second control means, responsive to result of determination that redundancy is not to be used by said determining means, control such that said corresponding redundant word line is set to a non-selected state.

15. The semiconductor memory device according to claim 14, wherein said first control means includes first signal generating means for generating a word line activating signal of a first level for activating said corresponding word line in response to said external address signal, means responsive to result of determination that redundancy is not to be used from said determining means for setting level of the word line activating signal which has been at said first level, and plurality of normal cell selecting means provided corresponding to said plurality of word lines, each responsive to said word line activating signal, for setting said corresponding word line to the selected state;

said second control means includes second signal generating means for generating a redundant word line activating signal of a first level for activating said corresponding redundant word line in response to said external address signal, means responsive to result of determination that redundancy is to be used from said determining means, for setting level of the redundant word line activating signal which has been at said first level to the activation level, and redundant cell selecting means provided corresponding to said plurality of redundant word lines, each responsive to said redundant word line activating signal, for setting said corresponding redundant word line to the selected state;

said first signal generating means inactivates, in response to result of determination that redundancy is to be used from said determining means, for inactivating said word line activating signal which has been activated; and said second signal generating means inactivates, in response to result of determination that redundancy is not to be used from said determining means, said redundant word line activating signal which has been activated.

16. The semiconductor memory device according to claim 15, wherein said first level is substantially an intermediate value between said activation level and a level for said inactivation.

17. The semiconductor memory device according to claim 16, further comprising decode means for decoding said external address signals; wherein said first control means generates said word line activating signal of said first level in response to a decode signal output from said decode means; and said second control means generates said redundant word line activating signal of said first level in response to a decode signal output from said decode means.

* * * * *